(12) United States Patent
Kokubun et al.

(10) Patent No.: US 11,831,335 B2
(45) Date of Patent: Nov. 28, 2023

(54) MEMORY SYSTEM AND CONTROL METHOD OF CONTROLLING NONVOLATILE MEMORY

(71) Applicant: Kioxia Corporation, Tokyo (JP)

(72) Inventors: Naoaki Kokubun, Kawasaki (JP); Yuki Kondo, Kawasaki (JP); Hironori Uchikawa, Fujisawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/807,038

(22) Filed: Jun. 15, 2022

(65) Prior Publication Data
US 2023/0299794 A1  Sep. 21, 2023

(30) Foreign Application Priority Data

Mar. 16, 2022  (JP) ................. 2022-041770

(51) Int. Cl.
*H03M 13/15* (2006.01)
(52) U.S. Cl.
CPC ..... *H03M 13/152* (2013.01); *H03M 13/1525* (2013.01); *H03M 13/1545* (2013.01)
(58) Field of Classification Search
CPC ........... H03M 13/152; H03M 13/1525; H03M 13/1545
See application file for complete search history.

(56) References Cited

U.S. PATENT DOCUMENTS

| 8,601,351 | B2 | 12/2013 | Wong et al. |
| 9,246,516 | B2 | 1/2016 | Kwok |
| 2004/0181735 | A1* | 9/2004 | Xin ..................... H03M 13/159 714/758 |
| 2012/0240013 | A1* | 9/2012 | Wong ................... H04L 1/1861 714/E11.032 |
| 2018/0097528 | A1 | 4/2018 | Ilani |
| 2018/0129564 | A1 | 5/2018 | Ilani |
| 2019/0253078 | A1 | 8/2019 | Goettfert et al. |

\* cited by examiner

*Primary Examiner* — Thien Nguyen
(74) *Attorney, Agent, or Firm* — Oblon, McClelland, Maier & Neustadt, L.L.P.

(57) ABSTRACT

A memory system includes a memory controller. The memory controller executes first calculation of obtaining a first degree to k-th degree error locator polynomials ($1 \leq k < t$) by using a syndrome, determines whether error locations can be calculated by the error locator polynomials up to the k-th degree, obtains an initial value of a parameter to be used for second calculation of obtaining error locator polynomials up to t-th degree when it is determined that the error locations cannot be calculated, executes the second calculation using the initial value, calculates the error locations by using an error locator polynomial determined to be able to calculate the error locations among the first degree to k-th degree error locator polynomials or by using error locator polynomials obtained in the second calculation, and corrects errors in the calculated error locations.

20 Claims, 21 Drawing Sheets

FIG.16

| ($|M_2|\neq 0$, $|M_3|\neq 0$, $|M_4|\neq 0$, $|M_5|\neq 0$) | $C(x)$ | $A(x)$ | $i$ | $\bar{d}$ |
|---|---|---|---|---|
| (*, 1, 1, 1) | $\sigma^{(4)}(x)$ | $x\sigma^{(3)}(x)$ | 4 | $|M_5|$ |
| (1, 0, 1, 1) | $\sigma^{(4)}(x)$ | $x^3\sigma^{(1)}(x)$ | 4 | $|M_4|/|M_2|$ |
| (1, 1, 1, 0) | $\sigma^{(3)}(x)$ | $x^3\sigma^{(2)}(x)$ | 4 | $|M_4|$ |
| (0, 1, 1, 0) | $\sigma^{(3)}(x)$ | $x^5\sigma^{(0)}(x)$ | 4 | $|M_3|$ |
| (1, 1, 0, *) | $\sigma^{(2)}(x)$ | $x^3\sigma^{(1)}(x)$ | 3 | $|M_3|$ |
| (1, 0, 0, 0) | $\sigma^{(1)}(x)$ | $x^5\sigma^{(0)}(x)$ | 3 | $|M_2|$ |
| (0, 0, 0, *) | $\sigma^{(0)}(x)$ | $x^4\sigma^{(0)}(x)$ | 2 | 1 |

MEMORY SYSTEM AND CONTROL METHOD OF CONTROLLING NONVOLATILE MEMORY

CROSS-REFERENCE TO RELATED APPLICATIONS

This application is based upon and claims the benefit of priority from Japanese Patent Application No. 2022-041770, filed on Mar. 16, 2022; the entire contents of which are incorporated herein by reference.

FIELD

Embodiments described herein relate generally to a memory system and a control method.

BACKGROUND

In order to protect data to be stored, a memory system generally stores data encoded by using error correction codes. Therefore, at the time of reading the data stored in the memory system, decoding is performed on the data encoded by using error correction codes.

BRIEF DESCRIPTION OF THE DRAWINGS

FIG. 16 is a diagram illustrating an example of a lookup table;

DETAILED DESCRIPTION

A memory system according to an embodiment includes a nonvolatile memory configured to store data encoded with an error correction code of correcting errors of t bits or less, and a memory controller. The memory controller is configured to: execute first calculation of obtaining first degree to k-th degree error locator polynomials ($1 \leq k < t$) by using a syndrome; determine whether error locations can be calculated by the error locator polynomials up to the k-th degree; obtain an initial value of a parameter to be used for second calculation of obtaining error locator polynomials up to t-th degree when it is determined that the error locations cannot be calculated; execute the second calculation using the initial value; calculate the error locations by using an error locator polynomial determined to be able to calculate the error locations among the first degree to k-th degree error locator polynomials or by using an error locator polynomial obtained by the second calculation; and correct the errors in the calculated error locations.

Hereinafter, a preferred embodiment of the memory system according to the present invention will be described in detail with reference to the accompanying drawings.

First Embodiment

Figure 1:
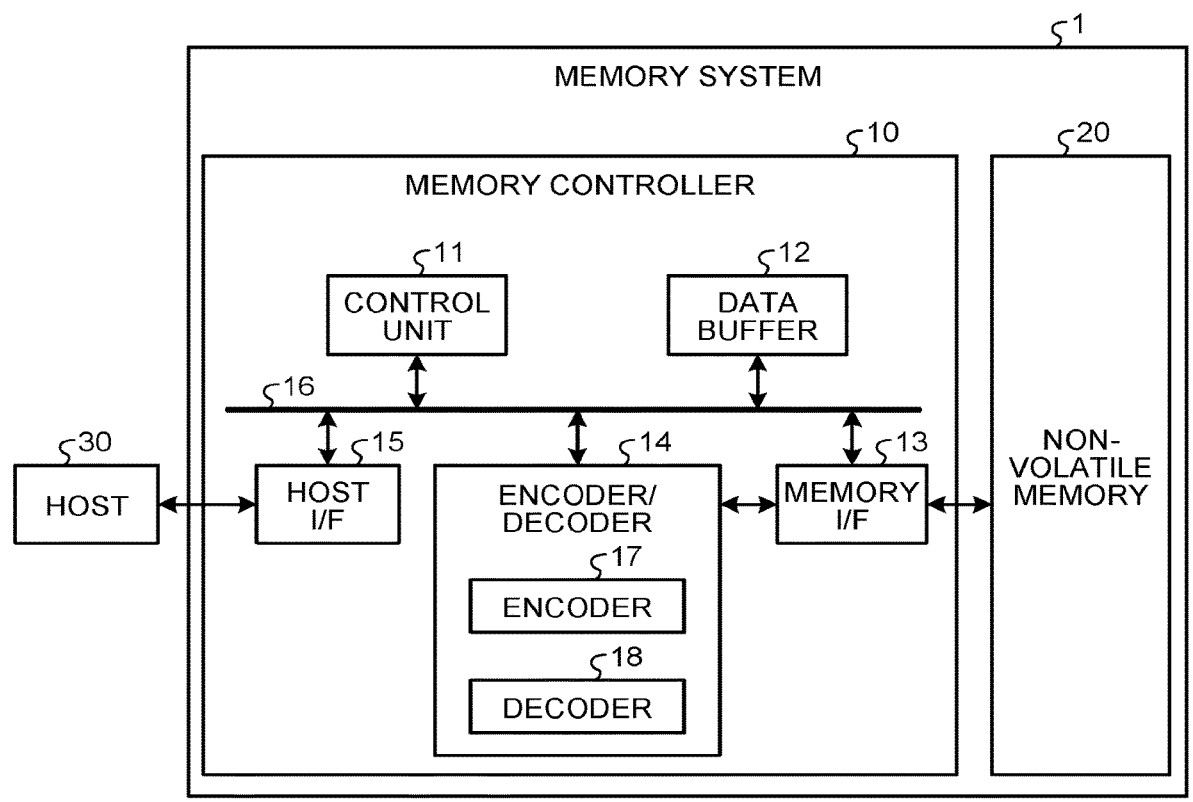
FIG. 1 is a block diagram of a memory system according to an embodiment.

First, a memory system according to a first embodiment will be described in detail with reference to the drawings. FIG. 1 is a block diagram illustrating a schematic configuration example of a memory system according to the first embodiment. As illustrated in FIG. 1, a memory system 1 includes a memory controller 10 and a nonvolatile memory 20. The memory system 1 can be connected to a host 30 and is illustrated in a state connected to the host 30, in FIG. 1. The host 30 may be an electronic device such as a personal computer or a mobile terminal.

The nonvolatile memory 20 is a nonvolatile memory that stores data in a nonvolatile manner, and an example of this is NAND flash memory (hereinafter simply referred to as NAND memory). The following description uses an exemplary case where the NAND memory is used as the nonvolatile memory 20. However, the nonvolatile memory 20 can include storage devices such as three-dimensional structure flash memory, Resistive Random Access Memory (ReRAM), or Ferroelectric Random Access Memory (FeRAM), other than the NAND memory. The nonvolatile memory 20 need not be semiconductor memory. The present embodiment can be applied to various storage media other than the semiconductor memory.

The memory system 1 may be various memory systems including the nonvolatile memory 20, such as a Solid State Drive (SSD) or a memory card incorporating the memory controller 10 and the nonvolatile memory 20 as one package.

The memory controller 10 controls writing to the nonvolatile memory 20 in accordance with a write request from the host 30. The memory controller 10 controls reading from the nonvolatile memory 20 in accordance with a read request from the host 30. An example of the memory controller 10 is a semiconductor integrated circuit configured as a System On a Chip (SoC). The memory controller 10 includes a host interface (host I/F) 15, a memory interface (memory I/F) 13, a control unit 11, an encoder/decoder (codec) 14, and a data buffer 12. The host I/F 15, the memory I/F 13, the control unit 11, the encoder/decoder 14, and the data buffer 12 are interconnected via an internal bus 16. Part or all of the operation of each of components of the memory controller 10 described below may be implemented by execution of firmware by a central processing unit (CPU) or may be implemented by hardware.

The host I/F 15 performs a process according to an interface standard with respect to the host 30, and outputs a command received from the host 30, user data to be written, or the like to the internal bus 16. The host I/F 15 transmits user data read from the nonvolatile memory 20 and restored, a response from the control unit 11, or the like to the host 30.

The memory I/F 13 performs writing processing to the nonvolatile memory 20 based on an instruction from the control unit 11. Further, the memory I/F 13 performs reading processing from the nonvolatile memory 20 based on an instruction from the control unit 11.

The control unit 11 comprehensively controls each of components of the memory system 1. In a case where a command is received from the host 30 via the host I/F 15, the control unit 11 performs control according to the command. For example, the control unit 11 instructs the memory I/F 13 to write user data and parity data to the nonvolatile memory 20 in accordance with a command from the host 30. Further, the control unit 11 instructs the memory I/F 13 to read user data and parity data from the nonvolatile memory 20 in accordance with a command from the host 30.

Moreover, in a case where a write request is received from the host 30, the control unit 11 determines a storage region (memory region) on the nonvolatile memory 20 for user data stored in the data buffer 12. That is, the control unit 11 manages the writing destination of user data. The correspondence between the logical address of the user data received from the host 30 and the physical address indicating the storage region on the nonvolatile memory 20 that stores the user data will be stored as an address conversion table.

Moreover, in a case where a read request is received from the host 30, the control unit 11 converts the logical address designated by the read request into a physical address using the above-described address conversion table, and instructs the memory I/F 13 to perform reading from the physical address.

In typical cases, NAND memory performs writing and reading in data units referred to as a page, and performs erasing in data units referred to as a block. In the present embodiment, a plurality of memory cells connected to an identical word line is referred to as a memory cell group. In a case where the memory cell is a single-level cell (SLC), one memory cell group corresponds to one page. In a case where the memory cell is a multi-level cell (MLC), one memory cell group corresponds to a plurality of pages. In the present description, an MLC includes a triple-level cell (TLC), and a quad-level cell (QLC). Each of memory cells is connected to a word line as well as to a bit line. Therefore, each of memory cells can be identified by an address for identifying a word line and an address for identifying a bit line.

The data buffer 12 temporarily stores user data received by the memory controller 10 from the host 30 until the user data is stored in the nonvolatile memory 20. The data buffer 12 temporarily stores the user data read from the nonvolatile memory 20 until the user data is transmitted to the host 30.

The data buffer 12 can be implemented by using general-purpose memory such as Static Random Access Memory (SRAM) or Dynamic Random Access Memory (DRAM). The data buffer 12 may be mounted outside the memory controller 10, rather than being built in the memory controller 10.

User data transmitted from the host 30 is transferred to the internal bus 16 and temporarily stored in the data buffer 12. The encoder/decoder 14 encodes user data stored in the nonvolatile memory 20 to generate a code word. The encoder/decoder 14 also decodes the received word read from the nonvolatile memory 20 and restores user data. Accordingly, the encoder/decoder 14 includes an encoder 17 and a decoder 18. The data encoded by the encoder/decoder 14 may include control data used inside the memory controller 10, in addition to user data.

Next, the writing processing according to the present embodiment will be described. The control unit 11 instructs the encoder 17 to encode user data at writing to the nonvolatile memory 20. At that time, the control unit 11 determines a storage location (storage address) of the code word in the nonvolatile memory 20, and instructs the memory I/F 13 about the determined storage location.

Based on the instruction from the control unit 11, the encoder 17 encodes the user data on the data buffer 12 to generate a code word. Examples of applicable coding methods include a coding method using an algebraic code such as a Bose-Chaudhuri-Hocquenghem (BCH) code and a Reed-Solomon (RS) code, and a coding method (product code or the like) using these codes as component codes in the row direction and the column direction. The memory I/F 13 performs control to store the code word to the storage location on the nonvolatile memory 20 instructed by the control unit 11. Hereinafter, a case of using a BCH code for correcting errors of t bits (t is an integer of 2 or more) or less will be described as an example.

Next, the processing at the time of reading from the nonvolatile memory 20 of the present embodiment will be described. At the time of reading from the nonvolatile memory 20, the control unit 11 designates an address on the nonvolatile memory 20 and instructs the memory I/F 13 to perform reading. The control unit 11 also instructs the decoder 18 to start decoding. The memory I/F 13 reads a received word from the designated address of the nonvolatile memory 20 in accordance with an instruction from the control unit 11, and inputs the read received word to the decoder 18. The decoder 18 decodes the received word read from the nonvolatile memory 20.

The decoder 18 decodes the received word read from the nonvolatile memory 20. The decoder 18 executes calculation of an error locator polynomial by combining the Peterson-Gorenstein-Zierler (PGZ) algorithm and the Berlekamp-Massey (BM) algorithm. The PGZ algorithm is an algorithm of solving simultaneous equations established between a coefficient $\sigma$ of an error locator polynomial and a syndrome by matrix calculation. The BM algorithm is an algorithm of sequentially solving simultaneous equations of a coefficient $\sigma$ and a syndrome using a polynomial equation.

Although the PGZ algorithm can calculate a plurality of error locator polynomials in parallel, the computational complexity for higher degree error locator polynomials tends to increase as compared with the BM algorithm. Note that the BM algorithm is a method of calculating an error locator polynomial by sequential processing, and thus is not suitable for parallel calculation.

In view of this, the decoder 18 calculates t error locator polynomials including first degree to t-th degree error locator polynomials corresponding to errors of 1 bit to t bits such that the low degree error locator polynomials that are not too complicated in computational complexity are calculated by using the PGZ algorithm (an example of the first calculation), and the error locator polynomials up to the t-th degree is calculated by using the BM algorithm (an example of the second calculation).

The low degree error locator polynomial is the first degree to k-th degree error locator polynomials (k is an integer satisfying $1 \leq k < t$). k is determined in advance according to a computational complexity or the like. Hereinafter, a case of k=4 will be described as an example by using a BCH code for correcting errors of 10 bits (t=10) or less.

Figure 2:
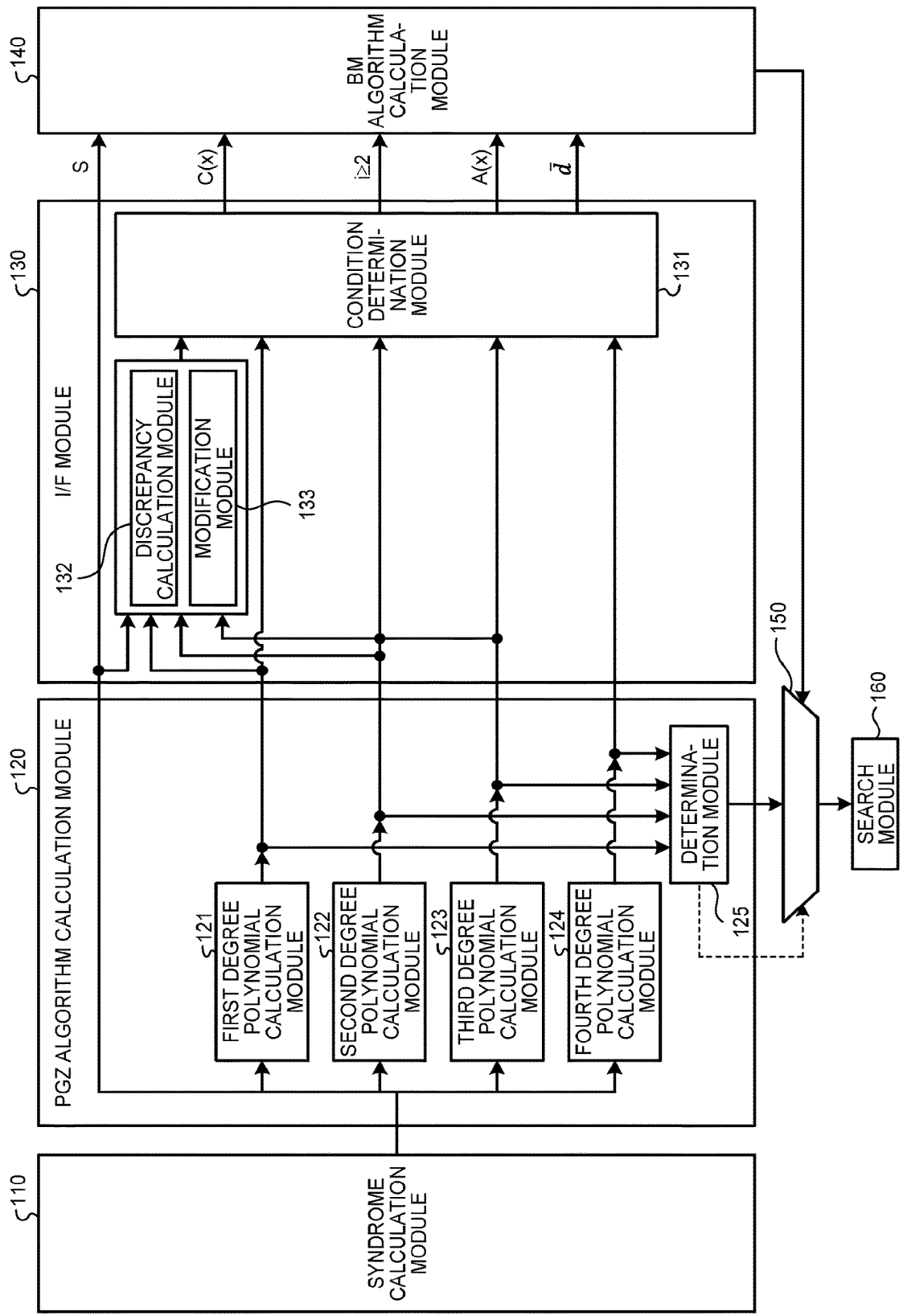
FIG. 2 is a block diagram of a decoder according to a first embodiment.

FIG. 2 is a block diagram illustrating a configuration example of the decoder 18 according to the present embodiment. As illustrated in FIG. 2, the decoder 18 includes a syndrome calculation module 110, a PGZ algorithm calculation module 120, an interface (I/F) module 130, a BM algorithm calculation module 140, a selection module 150, and a search module 160.

The syndrome calculation module 110 calculates syndromes using the received word read from the nonvolatile memory 20. Details of the syndrome calculation procedure will be described below. When the values of all the syndromes are zero, it can be determined that there is no error in the received word. Accordingly, the decoder 18 can end the decoding processing without executing the subsequent processing.

The PGZ algorithm calculation module 120 calculates an error locator polynomial by the PGZ algorithm using syndromes. The PGZ algorithm calculation module 120 includes a first degree polynomial calculation module 121, a second degree polynomial calculation module 122, a third degree polynomial calculation module 123, a fourth degree polynomial calculation module 124, and a determination module 125.

The PGZ algorithm calculation module 120 calculates four error locator polynomials, namely, the first to fourth degree error locator polynomials, rather than ten error locator polynomials, namely, all of the first to tenth degree error locator polynomials. That is, the first degree polynomial calculation module 121, the second degree polynomial calculation module 122, the third degree polynomial calculation module 123, and the fourth degree polynomial calculation module 124 respectively calculate first degree to fourth degree error locator polynomials by the PGZ algorithm.

The first degree polynomial calculation module 121, the second degree polynomial calculation module 122, the third degree polynomial calculation module 123, and the fourth degree polynomial calculation module 124 can each independently calculate an error locator polynomial. Therefore, some or all of the calculations by the first degree polynomial calculation module 121, the second degree polynomial calculation module 122, the third degree polynomial calculation module 123, and the fourth degree polynomial calculation module 124 may be executed in parallel. This makes it possible to further reduce the latency of the decoding processing.

The determination module 125 determines whether one or more error locations can be calculated by the first degree to fourth degree error locator polynomials calculated. When having determined that the error locations can be calculated by any of the first degree to fourth degree error locator polynomials, the determination module 125 outputs information indicating successful acquisition of the error locator polynomial capable of calculating error locations while outputting the error locator polynomial.

When the error locator polynomial capable of calculating the error locations has been obtained, the subsequent processing by the I/F module 130 and the BM algorithm calculation module 140 can be omitted. For example, the I/F module 130 may be configured to start the processing when there is no output, from the determination module 125, of information indicating the successful acquisition of the error locator polynomial capable of calculating the error locations.

When it is determined that the error locations cannot be calculated by the first degree to fourth degree error locator polynomials, the I/F module 130 functions as an interface that converts the calculation result by the PGZ algorithm calculation module 120 into information to be used for calculation by using the BM algorithm calculation module 140. For example, when it is determined that the error locations cannot be calculated by the first degree to fourth degree error locator polynomials, the I/F module 130 uses the first degree to fourth degree error locator polynomials and obtains an initial value of the parameter to be used in the BM algorithm.

Examples of the parameters used in the BM algorithm include the following parameters.

Error locator polynomial (first expression) successively modified by the BM algorithm Polynomial (second expression) used to modify the error locator polynomial by the BM algorithm Initial loop value representing initial value of number of repetitions of the modification Initial value of previous discrepancy used for modifying error locator polynomial by the BM algorithm The I/F module 130 includes a condition determination module 131, a discrepancy calculation module 132, and a modification module 133.

The condition determination module 131 determines whether a plurality of selection conditions for a plurality of determination values calculated using syndromes are satisfied. Various initial values of the parameters used in the BM algorithm are determined according to the determination result of the selection condition.

For example, the I/F module 130 obtains any of the error locator polynomials of the zeroth degree to K-th degree (the fourth degree when K=4) corresponding to the selection condition determined to be satisfied by the condition determination module 131 as an initial value C(x) of the error locator polynomial to be modified successively in the BM algorithm. In addition, the I/F module 130 obtains an initial loop value i used in the BM algorithm.

The discrepancy calculation module 132 calculates a discrepancy. The discrepancy is a value calculated from a syndrome and the first degree to fourth degree error locator polynomials, and can be used to determine whether the error locations can be calculated by the error locator polynomial.

The modification module 133 shifts and modifies the error locator polynomial, and obtains an initial value A(x) of the polynomial used for modifying the error locator polynomial. The error locator polynomial used for modification is, for example, the zeroth degree to (k−1)th degree error locator polynomials.

The BM algorithm calculation module 140 calculates an error locator polynomial by the BM algorithm using a syndrome S output from the I/F module 130, the initial value A(x) of the polynomial, the initial value C(x) of the error locator polynomial, the initial loop value i, and the initial value of the previous discrepancy, as parameters. For example, the BM algorithm calculation module 140 calculates the error locator polynomial by the BM algorithm (inversionless BM algorithm) not including inversion calculation. In FIG. 2, the initial value of the previous discrepancy is denoted by d with a bar above the letter (hereinafter, sometimes referred to as a d-bar).

The selection module 150 selects an error locator polynomial to be used for calculation of (search for) the error locations by the search module 160. For example, when the determination module 125 has determined that the error locations can be calculated by any of the first degree to fourth degree error locator polynomials, the selection module 150 selects the error locator polynomial determined to be able to calculate the error locations. When it is not determined the error locations can be calculated by any of the first degree to fourth degree error locator polynomials, the selection module 150 selects the error locator polynomial calculated by the BM algorithm calculation module 140.

The search module 160 performs search processing of calculating the error locations using the selected error locator polynomial. The search processing may be implemented by any method, and an example of the method is the Chien search. The Chien search is a method of sequentially substituting a value into an error locator polynomial so as to search for an error location based on a value at which an output value of the error locator polynomial becomes zero.

The decoder 18 corrects an error in the error location calculated by the search processing. For example, the decoder 18 executes error correction by inverting a bit at an error location.

Figure 3:
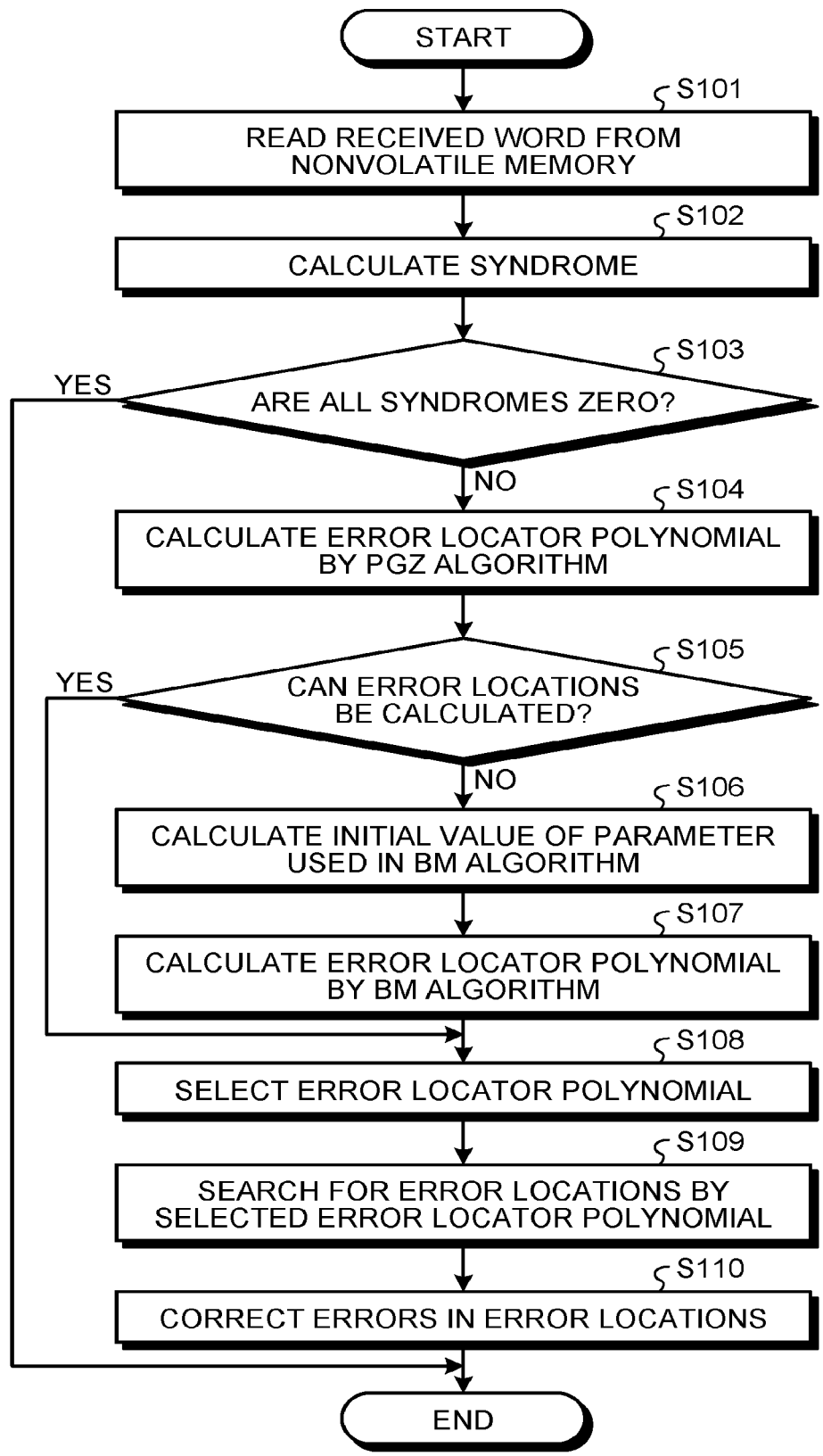
FIG. 3 is a flowchart of decoding processing according to the embodiment.

Next, a flow of decoding processing by the memory system 1 will be described. FIG. 3 is a flowchart illustrating an example of decoding processing according to the first embodiment.

The control unit 11 reads a data encoded by the error correction code from the nonvolatile memory 20, and obtains a received word (step S101). The control unit 11 also instructs the decoder 18 to start decoding.

The syndrome calculation module 110 of the decoder 18 calculates a syndrome from the received word (step S102). The decoder 18 determines whether the condition that the calculated values of all syndromes are zero is satisfied (step S103).

When the condition that all the syndromes are zero is satisfied (step S103: Yes), it can be determined that there is no error in the received word, and thus, the decoder 18 ends the decoding processing. When the condition that all the syndromes are zero is not satisfied (step S103: No), the PGZ algorithm calculation module 120 (including first degree polynomial calculation module 121, second degree polynomial calculation module 122, third degree polynomial calculation module 123, and fourth degree polynomial calculation module 124) calculates first to fourth degree error locator polynomials according to the PGZ algorithm (step S104).

The determination module 125 determines whether the error locations can be calculated by the calculated first degree to fourth degree error locator polynomials (step S105). When it is determined that the error locations cannot be calculated (step S105: No), the I/F module 130 calculates an initial value of a parameter to be used in the BM algorithm (step S106). The BM algorithm calculation module 140 calculates an error locator polynomial by the BM algorithm using the calculated initial value (step S107).

The selection module 150 selects either the error locator polynomial determined to be able to calculate the error locations (step S105: Yes) among the error locator polynomials calculated by the PGZ algorithm calculation module 120 or the error locator polynomial calculated by the BM algorithm calculation module 140 (step S108).

The search module 160 searches for the error locations by the selected error locator polynomial (step S109). The decoder 18 corrects the error in the error locations obtained by the search (step S110), and ends the decoding processing.

Figure 4:
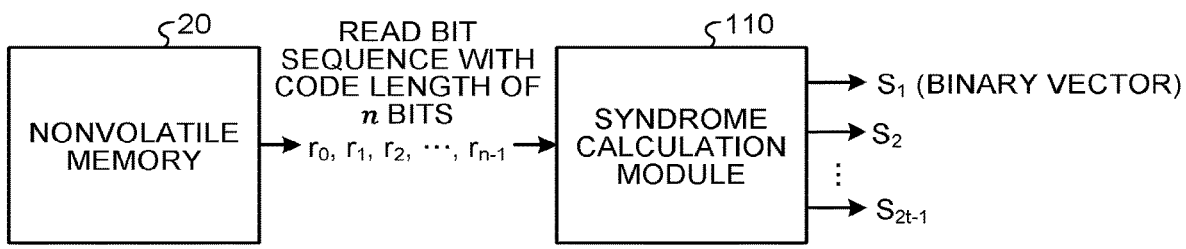
FIG. 4 is a diagram illustrating an example of a syndrome calculation procedure.
Figure 5:
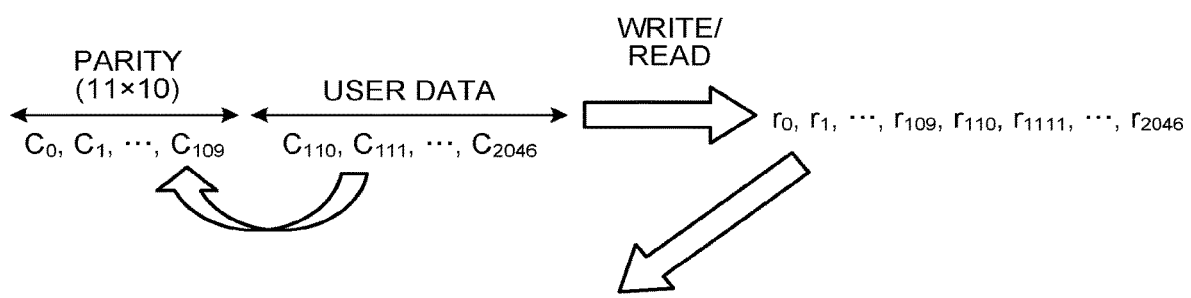
FIG. 5 is a diagram illustrating an example of a syndrome calculation procedure.
Figure 6:
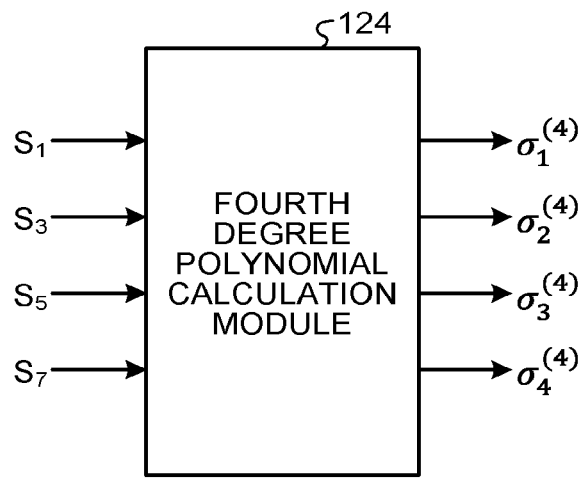
FIG. 6 is a diagram illustrating a configuration example of a fourth degree polynomial calculation module.

Next, details of the syndrome calculation procedure will be described. FIGS. 4 and 5 are diagrams illustrating an example of a syndrome calculation procedure performed by the syndrome calculation module 110.

From the nonvolatile memory 20, a read bit sequence $r_0$, $r_1, r_2, \ldots, r_{n-1}$ having a code length of n bits is read as a received word. The syndrome calculation module 110 inputs these received words and calculates (2t−1) syndromes $S_1$, $S_2, \ldots, S_{2t-1}$.

FIG. 5 illustrates an example of a syndrome in a case of using the code length n is 2047=211−1 bits and a BCH code capable of correcting errors of 10 bits (t=10) or less. In this example, 1937 (=2047−110) bits of user data $c_{110}$ to $c_{2046}$ are used to generate 110 bits being parity bits $c_0$ to $c_{109}$, and data of a total of 2047 bits is written into the nonvolatile memory 20. This data is read from the nonvolatile memory 20 as received words $r_0$ to $r_{2046}$ of 2047 bits.

The syndrome calculation module 110 calculates a syndrome $S_i$ from the received word by using the calculation formula illustrated in the lower part of FIG. 5, where i is an integer of 1 or more and 19(=2t−1=2×10−1) or less; α is a specific value referred to a primitive element of a Galois Field, and follows a specific arithmetic operations.

Note that the syndrome calculation procedure illustrated in FIGS. 4 and 5 is an example, and the present invention is not limited thereto. Any conventional calculation procedure may be applied depending on the error correction code to be applied, the number of correctable bits, and the like.

Next, details of the function of the PGZ algorithm calculation module 120 will be described. The first degree polynomial calculation module 121, the second degree polynomial calculation module 122, the third degree polynomial calculation module 123, and the fourth degree polynomial calculation module 124 calculate error locator polynomials by the following formulas (1), (2), (3), and (4), respectively.

$$\sigma^{(1)}(x) = \sigma_0^{(1)} + \sigma_1^{(1)}x = 1 + S_1 x \tag{1}$$

$$\sigma^{(2)}(x) = \sigma_0^{(2)} + \sigma_1^{(2)}x + \sigma_2^{(2)}x^2 = 1 + S_1 x + \frac{|M_3|}{|M_2|}x^2 \tag{2}$$

$$\sigma^{(3)}(x) = \sigma_0^{(3)} + \sigma_1^{(3)}x + \sigma_2^{(3)}x^2 + \sigma_3^{(3)}x^3 = 1 + S_1 x + \frac{s_1^2 s_3 + s_5}{|M_3|}x^2 + \frac{|M_4|}{|M_3|}x^3 \tag{3}$$

$$\sigma^{(4)}(x) = \sigma_0^{(4)} + \sigma_1^{(4)}x + \sigma_2^{(4)}x^2 + \sigma_3^{(4)}x^3 + \sigma_4^{(4)}x^4 = 1 + S_1 x + \frac{S_1^8 + S_1^5 S_3 + S_1 S_7 + S_3 S_5}{|M_4|}x^2 + \frac{S_1^6 S_3 + S_1^4 S_5 + S_1^2 S_7 + S_3^3}{|M_4|}x^3 + \frac{|M_5|}{|M_4|}x^4 \tag{4}$$

where $S_i$ included in each formula represents the syndrome $S_i$ calculated as illustrated in FIGS. 4 and 5, for example. In addition, $|M_2|$, $|M_3|$, $|M_4|$, and $|M_5|$ included in Formulas (2), (3), and (4) are calculated by the following Formula (5).

$$|M_2|=S_1, \ |M_3|=S_1^3+S_3, \ |M_4|=S_1^3+S_1 S_3+S_1 S_5+S_3^2,$$
$$|M_5|=S_1^{10}+S_1^7 S_3+S_1 S_3^3+S_1^5 S_5+S_1^2 S_3 S_5+S_1^3 S_7+$$
$$S_3 S_7+S_5^2 \tag{5}$$

Formulas (1), (2), (3), and (4) are examples of calculating the error locator polynomial using only odd-numbered syndromes, that is, syndromes in which i is an odd number. FIG.

6 is a diagram illustrating a configuration example of the fourth degree polynomial calculation module 124 that calculates a fourth degree error locator polynomial using Formula (4). Note that, by replacing the input and output corresponding to Formula (4) with the input and output corresponding to Formulas (1), (2), and (3), individually, it is possible to obtain configurations corresponding to the first degree polynomial calculation module 121, the second degree polynomial calculation module 122, and the third degree polynomial calculation module 123, individually.

The fourth degree polynomial calculation module 124 inputs four syndromes $S_1$, $S_3$, $S_5$, and $S_7$, and outputs $\sigma_1^{(4)}$, $\sigma_2^{(4)}$, $\sigma_3^{(4)}$, and $\sigma_4^{(4)}$ being coefficients of the terms x, $x^2$, $x^3$, and $x^4$ respectively included in the polynomial. In this example, since $\sigma_0^{(4)}$ corresponding to the constant term is a fixed value 1 in the error locator polynomials of all the dimensions, the output of this value omitted.

The reason of using only a syndrome in which i is an odd number is that a syndrome in which i is an even number can be calculated using a syndrome in which i is an odd number. For example, $S_2$ can be calculated by the square of $S_1$ ($S_2 = S_1^2$).

Figure 7:
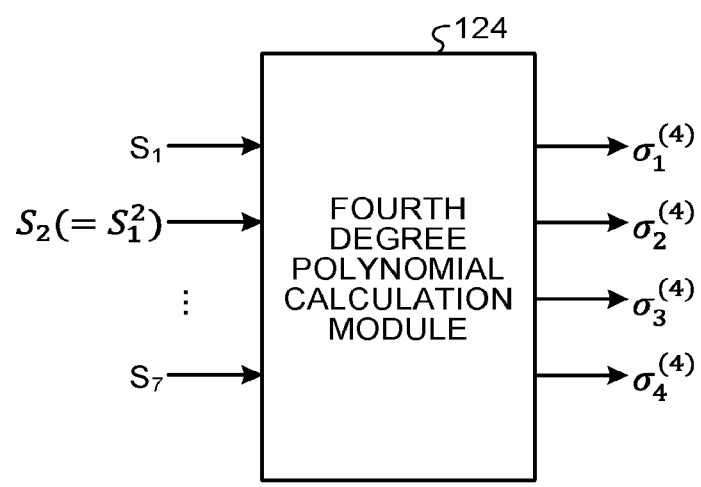
FIG. 7 is a diagram illustrating a configuration example of a fourth degree polynomial calculation module.

For the purpose of reducing the circuit area or the latency, it is also allowable to configure to also input a syndrome in which i is an even number and calculate an error locator polynomial. FIG. 7 is a diagram illustrating a configuration example of the fourth degree polynomial calculation module 124 configured in this manner. For example, the fourth degree polynomial calculation module 124 also inputs a syndrome in which i is an even number, such as $S_2$ so as to be used for calculation of an error locator polynomial.

Formulas (2), (3) and (4) include calculation of an inverse element. For example, Formula (2) includes calculation $1/|M_2|$ being the inverse of $|M_2|$. In general, inversion requires more computation time. Therefore, the PGZ algorithm calculation module 120 may be configured to use a calculation formula including no inversion. For example, the second degree polynomial calculation module 122, the third degree polynomial calculation module 123, and the fourth degree polynomial calculation module 124 may calculate the error locator polynomial by the following formulas (6), (7), and (8), respectively. Note that $|M_2|$, $|M_3|$, $|M_4|$, and $|M_5|$ are calculated by the above Formula (5).

$$\sigma^{(2)}(x) = \sigma_0^{(2)} + \sigma_1^{(2)}x + \sigma_2^{(2)}x^2 = |M_2| + S_1|M_2|x + |M_3|x^2 \quad (6)$$

$$\sigma^{(3)}(x) = \sigma_0^{(3)} + \sigma_1^{(3)}x + \sigma_2^{(3)}x^2 + \sigma_3^{(3)}x^3 = \quad (7)$$
$$|M_3| + S_1|M_3|x + (S_1^2 S_3 + S_5)x^2 + |M_4|x^3$$

$$\sigma^{(4)}(x) = \sigma_0^{(4)} + \sigma_1^{(4)}x + \sigma_2^{(4)}x^2 + \sigma_3^{(4)}x^3 + \sigma_4^{(4)}x^4 = |M_4| + S_1|M_4|x + \quad (8)$$
$$(S_1^8 + S_1^5 S_3 + S_1 S_7 + S_3 S_5)x^2 + (S_1^6 S_3 + S_1^4 S_5 + S_1^2 S_7 + S_3^3)x^3 + |M_5|x^4$$

Formulas (2), (3), and (4) multiplied by $|M_2|$, $|M_3|$, and $|M_4|$ are Formulas (6), (7), and (8), respectively, and hence the roots of Formulas (6), (7), and (8) are the same as those of Formulas (2), (3), and (4), respectively. However, since $\sigma_0^{(2)}$, $\sigma_0^{(3)}$, and $\sigma_0^{(4)}$ of Formulas (6), (7), and (8) are not 1 but $|M_2|$, $|M_3|$, and $|M_4|$, respectively, it is necessary to include $\sigma_0^{(2)}$, $\sigma_0^{(3)}$, and $\sigma_0^{(4)}$ in the output.

Figure 8:
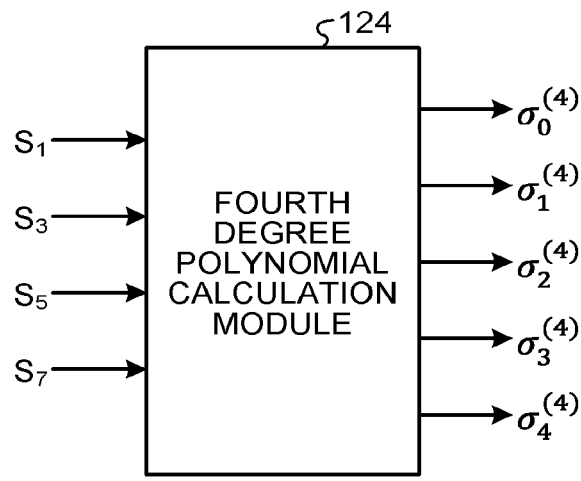
FIG. 8 is a diagram illustrating a configuration example of a fourth degree polynomial calculation module.

FIG. 8 is a diagram illustrating a configuration example of the fourth degree polynomial calculation module 124 when using a calculation formula that does not include inversion. In this case, as illustrated in FIG. 8, the fourth degree polynomial calculation module 124 outputs not only $\sigma_1^{(4)}$, $\sigma_2^{(4)}$, $\sigma_3^{(4)}$, and $\sigma_4^{(4)}$ but also $\sigma_0^{(4)}$.

Figure 9:
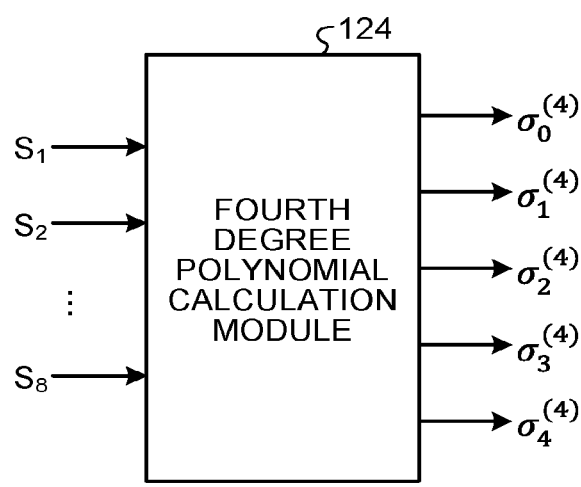
FIG. 9 is a diagram illustrating a configuration example of a fourth degree polynomial calculation module.

FIG. 9 is a diagram illustrating a configuration example of the fourth degree polynomial calculation module 124 when inputting also a syndrome in which i is an even number, and when using a calculation formula that does not include inversion. The fourth degree polynomial calculation module 124 in FIG. 9 corresponds to a configuration obtained by altering the fourth degree polynomial calculation module 124 in FIG. 8 so as to input also a syndrome in which i is an even number.

Next, details of the determination processing by the determination module 125 will be described.

In general, a v-th degree (v is an integer of 1 or more and t or less) error locator polynomial $\sigma(x)$ is expressed by the following Formula (9). For example, by setting v to 4, the fourth degree error locator polynomial $\sigma(x)$ is expressed similarly to Formula (4) or (8).

$$\sigma(x) = \sigma_0 + \sigma_1 x + \ldots + \sigma_v x^v, \; v = \deg \sigma(x) \leq t \quad (9)$$

Syndromes and error locator polynomials are input to the determination module 125. For example, when t=10, syndromes $S_1$ to $S_{19}$ and $\sigma_0$ to $\sigma_{10}$ an representing coefficients of the error locator polynomials are input. Using the input syndromes and error locator polynomials, the determination module 125 calculates a discrepancy by the following Formula (10).

$$d(S_\mu, \sigma(x)) \equiv \begin{cases} S_\mu \sigma_0 + S_{\mu-1}\sigma_1 + \ldots + S_1 \sigma_{\mu-1} + \sigma_\mu & (\mu \leq v) \\ S_\mu \sigma_0 + S_{\mu-1}\sigma_1 + \ldots + S_{\mu-(v-1)}\sigma_{v-1} + S_{\mu-v}\sigma_v & (\mu > v) \end{cases} \quad (10)$$

For example, regarding the fourth degree error locator polynomial, the determination module 125 calculates ten types of discrepancies $d(S_1, \sigma^{(4)}(x))$ to $d(S_{19}, \sigma^{(4)}(x))$ by using ten types of odd-numbered syndromes $S_1$ to $S_{19}$ using the following Formula (11).

$$d(S_1, \sigma^{(4)}(x)) = S_1 \sigma_0^{(4)} + \sigma_1^{(4)}$$

$$d(S_3, \sigma^{(4)}(x)) = S_3 \sigma_0^{(4)} + S_2 \sigma_1^{(4)} + S_1 \sigma_2^{(4)} + \sigma_3^{(4)}$$

$$d(S_5, \sigma^{(4)}(x)) = S_5 \sigma_0^{(4)} + S_4 \sigma_1^{(4)} + S_3 \sigma_2^{(4)} + S_2 \sigma_3^{(4)} + S_1 \sigma_4^{(4)}$$

$$\vdots$$

$$d(S_{17}, \sigma^{(4)}(x)) = S_{17}\sigma_0^{(4)} + S_{16}\sigma_1^{(4)} + S_{15}\sigma_2^{(4)} + S_{14}\sigma_3^{(4)} + S_{13}\sigma_4^{(4)}$$

$$d(S_{19}, \sigma^{(4)}(x)) = S_{19}\sigma_0^{(4)} + S_{18}\sigma_1^{(4)} + S_{17}\sigma_2^{(4)} + S_{16}\sigma_3^{(4)} + S_{15}\sigma_4^{(4)} \quad (11)$$

When the values of all discrepancies are zero, the determination module 125 determines that the error locations can be calculated by the input error locator polynomial. The determination module 125 outputs determination information indicating whether an error locator polynomial capable of calculating the error locations has been obtained, and also outputs the error locator polynomial. The determination information is, for example, a control signal indicating either "True" representing that all the discrepancies are zero or "False" representing that discrepancies other than zero are included.

For example, when the determination information indicating "True" has been output, the selection module 150 selects the error locator polynomial output from the determination module 125. When the determination information indicating "False" has been output, the selection module 150 selects the error locator polynomial output from the BM algorithm calculation module 140. Furthermore, the I/F module 130 may be configured to start processing in a case where determination information indicating "False" has been output.

Figure 10:
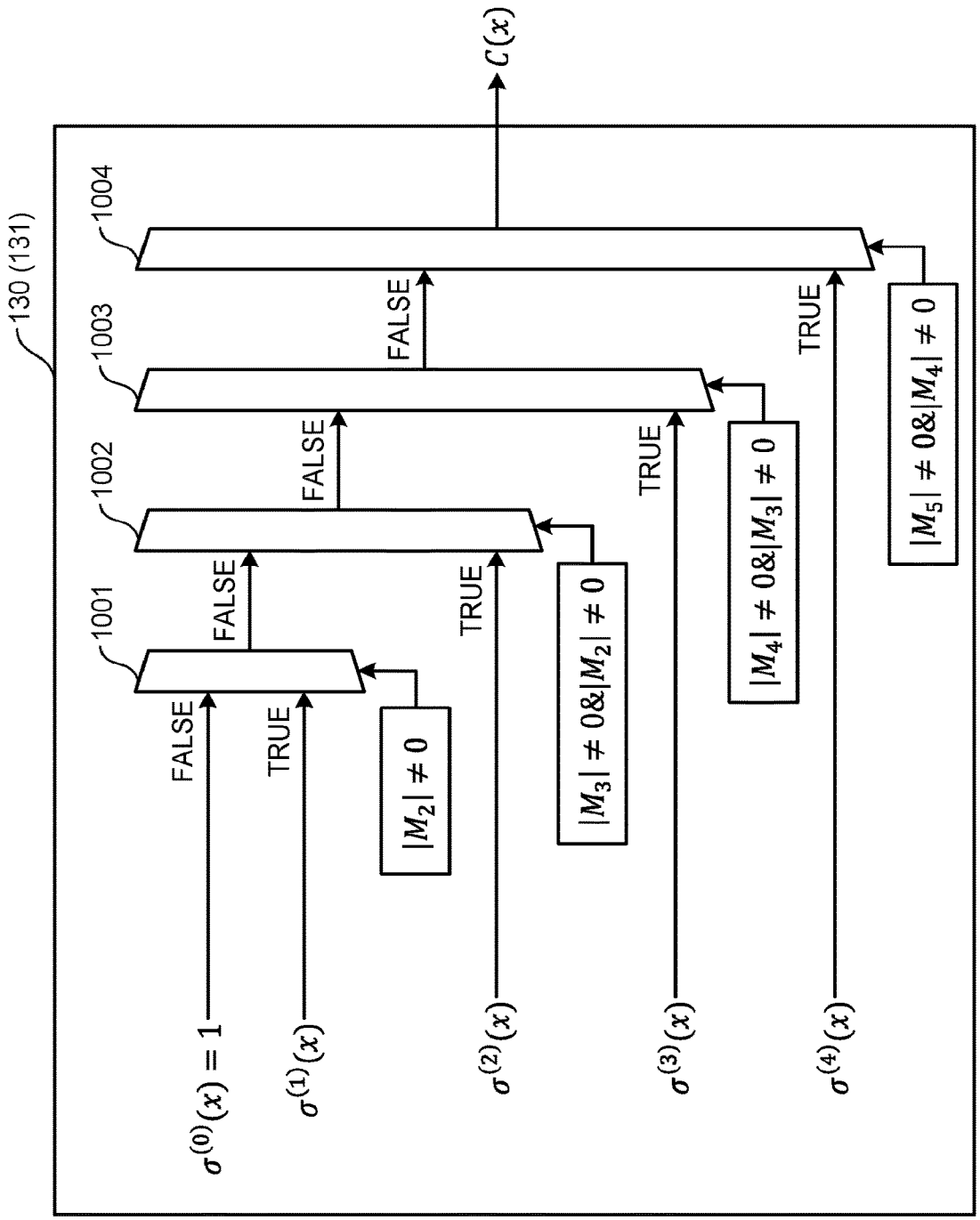
FIG. 10 is a diagram illustrating an example of a function of a condition determination module.

Next, details of the function of the I/F module 130 will be described. FIG. 10 is a diagram illustrating an example of functions mainly implemented by the condition determination module 131. The condition determination module 131 includes selectors 1001 to 1004. As described below, each of the selectors 1001 to 1004 is associated with a selection condition for a predefined determination value.

(A1) Selector 1001
  Determination value: $|M_2|$
  Selection condition: $|M_2| \neq 0$
(A2) Selector 1002
  Determination value: $|M_3|$, $|M_2|$
  Selection condition: $|M_3| \neq 0$ & $|M_2| \neq 0$
(A3) Selector 1003
  Determination value: $|M_4|$, $|M_3|$
  Selection condition: $|M_4| \neq 0$ & $|M_3| \neq 0$
(A4) Selector 1004
  Determination value: $|M_5|$, $|M_4|$
  Selection condition: $|M_5| \neq 0$ & $|M_4| \neq 0$ The condition determination module 131 determines whether the selection condition corresponding to each of the selectors 1001 to 1004 is satisfied, and outputs an input value, out of the two input values, selected by the corresponding selector according to a determination result.

For example, regarding the selector 1001, out of two input values $\sigma^{(0)}(x)$ and $\sigma^{(1)}(x)$, the condition determination module 131 outputs $\sigma^{(0)}(x)$ when a determination result is ("False") indicating that the selection condition is not satisfied, or outputs $\sigma^{(1)}(x)$ when a determination result is ("True") indicating that the selection condition is satisfied.

Incidentally, $\sigma^{(0)}(x)$ can be interpreted as value corresponding to a zeroth degree error locator polynomial, that is, an error locator polynomial having a constant term alone. An example of $\sigma^{(0)}(x)$ is a fixed value 1.

FIG. 10 illustrates an example of condition determination processing used to obtain the initial value C(x) of the error locator polynomial among the parameters used in the BM algorithm. In this case, any one of the five error locator polynomials $\sigma^{(0)}(x)$ to $\sigma^{(4)}(x)$ is selected and output as the initial value C(x) of the error locator polynomial used in the BM algorithm. When the BM algorithm calculation module 140 uses the BM algorithm without inversion, $\sigma^{(1)}(x)$, $\sigma^{(2)}(x)$, $\sigma^{(3)}(x)$, and $\sigma^{(4)}(x)$ are calculated using Formulas (1), (6), (7), and (8), respectively.

Note that $|M_4| \neq 0$ means that the degree of the polynomial used in the BM algorithm is 4 or 3. Similarly, $|M_5| \neq 0$ means that the degree of the polynomial is 5 or 4. Therefore, for example, the selection condition for the selector 1004 indicates that the degree of the polynomial is either 5 or 4 and either 4 or 3, that is, the degree of the polynomial is 4.

Note that $|M_5|$ and $|M_4|$ used for determination value of the selector 1004 equal to the highest degree coefficients of $\sigma_4^{(4)}$ and $\sigma_3^{(3)}$ in Formula (8) and (7), respectively. Therefore the output $\sigma_4^{(4)}$ of fourth degree polynomial calculation module 124 and the output $\sigma_3^{(3)}$ of third degree polynomial calculation module 123 can be used for the selection condition of the selector 1004. When this selection condition is satisfied, the I/F module 130 outputs the fourth degree error locator polynomial as the initial value C(x) of the error locator polynomial.

The condition determination processing similar to the processing of FIG. 10 can also be used to obtain the initial loop value i, the initial value A(x) of the polynomial, and the initial value d-bar of the previous discrepancy.

Figure 11:
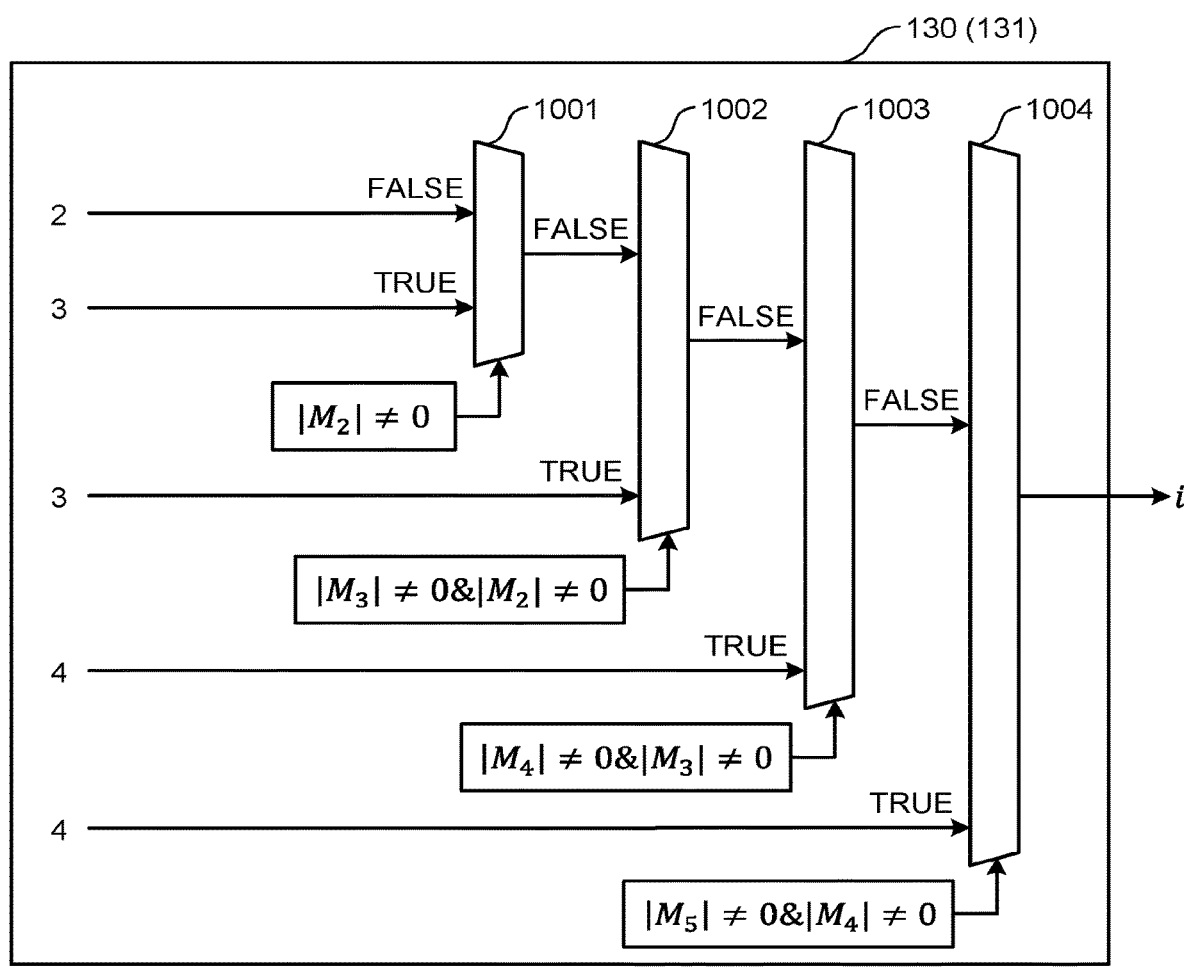
FIG. 11 is a diagram illustrating an example of an I/F module.

FIG. 11 is a diagram illustrating an example of a function of the I/F module 130 when obtaining the initial loop value i. In this case, the input values are 2, 3, and 4. The condition determination module 131 outputs, as the initial loop value i, an input value selected in accordance with the selection condition illustrated in FIG. 11 among these input values.

Note that the initial loop value i being 4 means that the calculation of the error locator polynomial by the BM algorithm is started with the fourth degree error locator polynomial as an initial value. Therefore, for example, the latency can be reduced as compared with the BM algorithm in which the zeroth degree error locator polynomial is set as the initial value and the initial loop value i is set to 0. In a case where the initial loop value i is 2 or 3, there would be a possibility of a decrease in the amount of reduction of latency. However, for a random error, for example, the frequency at which the initial loop value i is 2 or 3 is low, and in most cases, the initial loop value i is 4.

Figure 12:
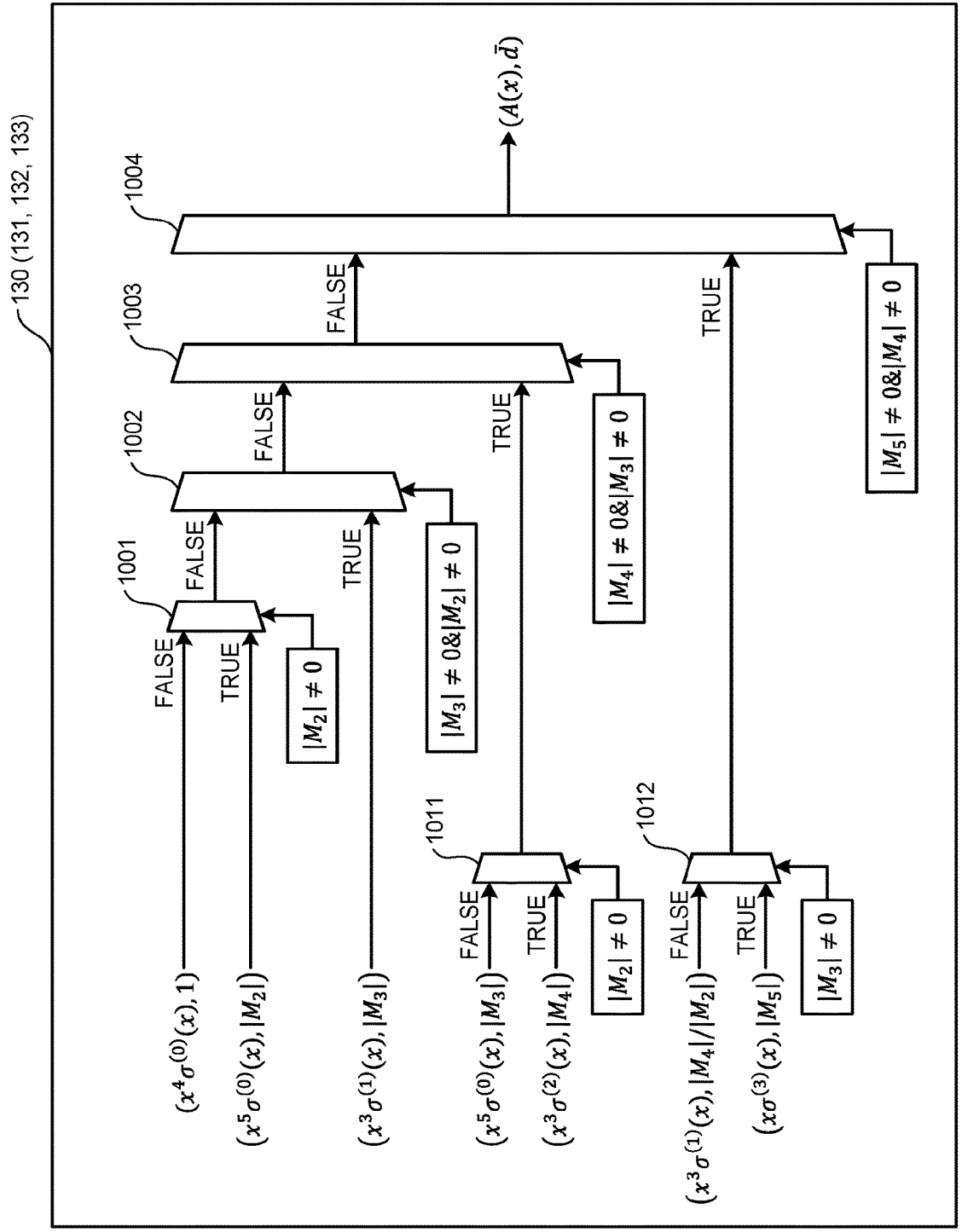
FIG. 12 is a diagram illustrating an example of an I/F module.

FIG. 12 is a diagram illustrating an example of the function of the I/F module 130 when obtaining the initial value A(x) of the polynomial and the initial value d-bar of the previous discrepancy. The functions illustrated in FIG. 12 are implemented by the condition determination module 131, the discrepancy calculation module 132, and the modification module 133, for example.

The selectors 1001 and 1004 used in the condition determination processing is similar to the selectors in FIG. 10, and thus, is denoted by the same reference numeral, and the detailed description thereof will be omitted.

For example, the condition determination module 131 further includes selectors 1011 and 1012. The selectors 1011 and 1012 are used to select one of input values to be input to the selectors 1003 and 1004, respectively. The selectors 1011 and 1012 are associated with selection conditions for predefined determination values as follows.

(B1) Selector 1011
  Determination value: $|M_2|$
  Selection condition: $|M_2| \neq 0$
(B2) Selector 1012
  Determination value: $|M_3|$
  Selection condition: $|M_3| \neq 0$ The condition determination module 131 determines whether the selection condition corresponding to each of the selectors 1011 and 1012 is satisfied, and outputs an input value, among the two input values, selected by the corresponding selector according to the determination result.

In the example of FIG. 12, the input value is a set of a polynomial obtained by shifting any of the error locator polynomials $\sigma^{(0)}(x)$ to $\sigma^{(3)}(x)$ and a discrepancy of the error locator polynomial. The condition determination module 131 outputs, as a set of the initial value A(x) of the polynomial and the initial value d-bar of the previous discrepancy, the input value selected according to the selection condition illustrated in FIG. 12 among these input values.

The modification module 133 modifies the error locator polynomial by performing calculation of shifting the error locator polynomial. Shifting the polynomial means multiplying x to the j-th power (j is a predetermined integer of 1 or more) to increase the degree of the polynomial.

For example, the input values selected by the selector 1012 in the case of the determination result ("False") include a shift result of the polynomial calculated by the following Formula (12) and include a discrepancy calculated by $|M_4|/|M_2|$. Instead of these input values, the set of cA(x) and d-bar multiplied by c may be used in the BM algorithm, where c is an arbitrary constant. Therefore, if c is $|M_2|=S_1$, the input values selected by the selector 1012 may be a polynomial calculated by the following Formula (13) and $|M_4|$.

$$x^3 \sigma^{(1)}(x) = \sigma_0^{(1)} x^3 + \sigma_1^{(1)} x^4 = x^3 + S_1 x^4 \quad (12)$$

$$x^3 |M_2| \sigma^{(1)}(x) = |M_2| \sigma_0^{(1)} x^3 + |M_2| \sigma_1^{(1)} x^4 = S_1 x^3 + S_1^2 x^4 \quad (13)$$

As illustrated in FIG. 12, other input values can also be obtained from a result of shifting any of the error locator polynomials $\sigma^{(0)}(x)$ to $\sigma^{(3)}(x)$ and a discrepancy calculated using $|M_2|$, $|M_3|$, $|M_4|$, $|M_5|$, etc. calculated by the above Formula (5). Among these input values, the input value selected according to the selection condition illustrated in FIG. 12 is selected and output as the initial value A(x) of the polynomial used in the BM algorithm and the initial value d-bar of the previous discrepancy.

Figure 13:
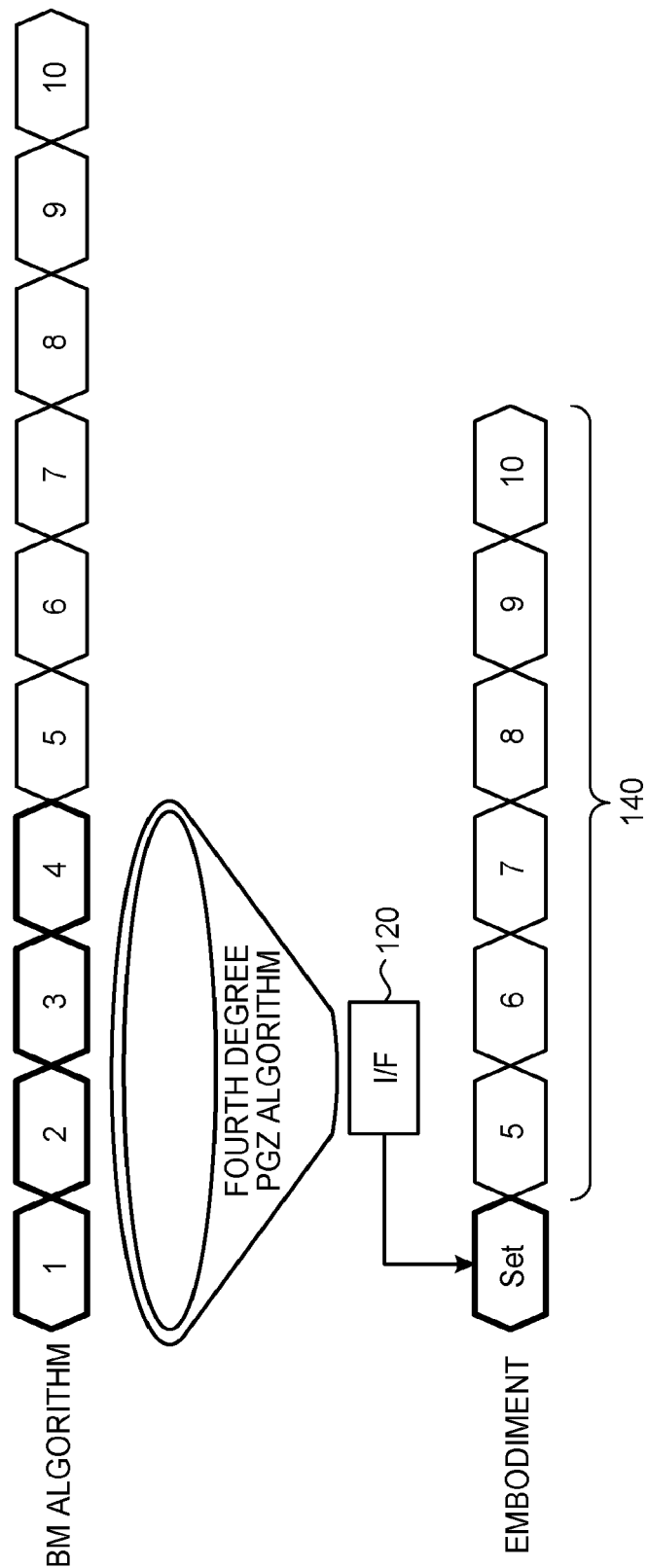
FIG. 13 is a diagram illustrating an example of a latency reduction effect.

FIG. 13 is a diagram illustrating an example of a latency reduction effect according to the present embodiment. The upper part of FIG. 13 illustrates an example of a timing diagram in a case of calculating the error locator polynomials up to the tenth degree using the BM algorithm alone. In the example of FIG. 13, first degree to tenth degree error locator polynomials are sequentially calculated by the BM algorithm in ten time units (for example, clocks). Even with an increase in the computational complexity of the higher degree error locator polynomial, the BM algorithm can complete the calculation. On the other hand, the BM algorithm cannot calculate a plurality of error locator polynomials in parallel, for example.

The lower part of FIG. 13 illustrates an example of a timing diagram in a case of calculating tenth degree error locator polynomial by the method of the present embodiment. In the present embodiment, the PGZ algorithm calculation module 120 uses the PGZ algorithm to calculate low degree (for example, first degree to fourth degree) error locator polynomials. With the calculation executed in parallel, it is possible to calculate four first degree to fourth degree error locator polynomials in one time unit, for example. When it is determined that the error locations cannot be calculated by four polynomials, namely, the first degree to fourth degree error locator polynomials, the calculation of the fifth degree and subsequent error locator polynomials can be handed over to the BM algorithm calculation module 140. This makes it possible to achieve reduction of the latency of the decoding processing (in the example of FIG. 13, reduction by three time units), leading to improvement of error correction capability.

(First Modification)

Figure 14:
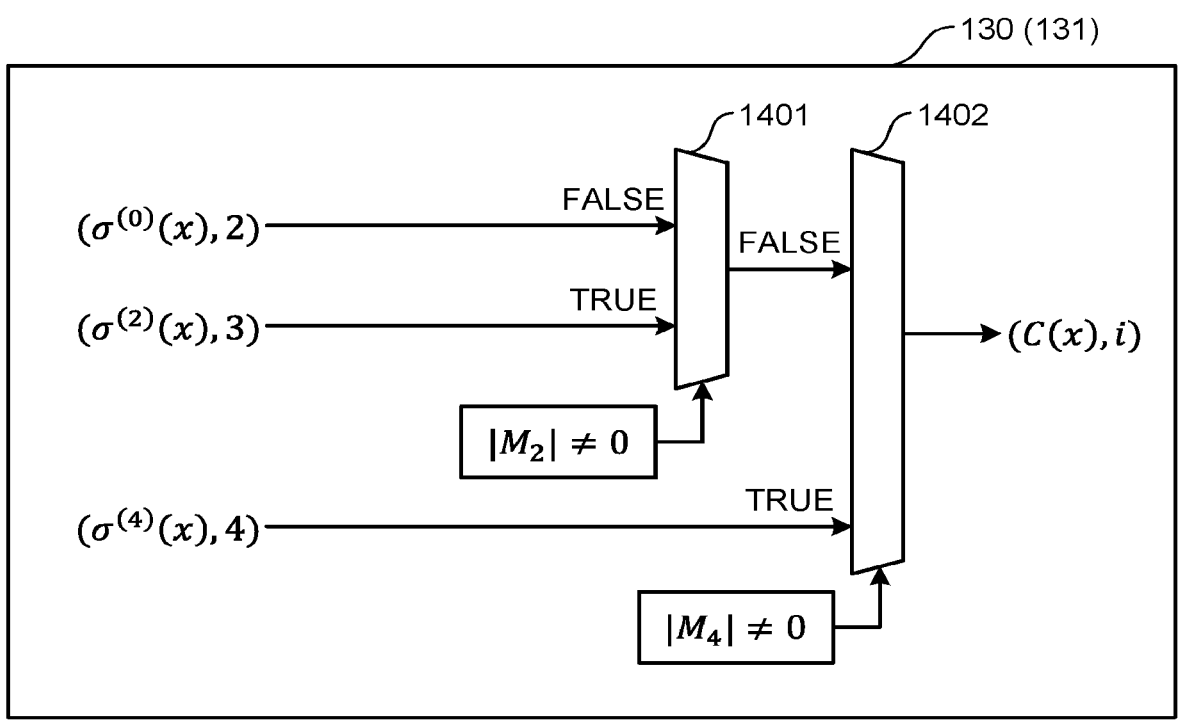
FIG. 14 is a diagram illustrating an example of an I/F module according to a modification.

The configuration of the I/F module 130 is not limited to the above. In the first modification, another configuration example of the I/F module 130 will be described. FIG. 14 is a diagram illustrating an example of a function of the I/F module 130 of the present modification. The condition determination module 131 of the present modification includes selectors 1401 and 1402 associated with selection conditions for the determination values illustrated in FIG. 14.

FIG. 14 is an integrated illustration of the function of obtaining the initial value C(x) of the error locator polynomial and obtaining the initial loop value i. Accordingly, the input value is represented by a set of values (error locator polynomial, initial loop value). The error locator polynomial included in the input value is any of $\sigma^{(0)}(x)$, $\sigma^{(2)}(x)$, and $\sigma^{(4)}(x)$. The initial loop value included in the input value is any of 2, 3, and 4. The condition determination module 131 outputs the input value selected according to the selection condition illustrated in FIG. 14 among these input values, as the initial value C(x) of the error locator polynomial and the initial loop value i.

Incidentally, when the condition of outputting $\sigma^{(3)}(x)$ is satisfied (specifically, $|M_5|=0$), $\sigma^{(4)}(x)=\sigma^{(3)}(x)$ holds. Therefore, the output of the third degree error locator polynomial can substitute the output of the fourth degree error locator polynomial. In consideration of such a relationship, the present modification is configured such that $\sigma^{(3)}(x)$ is not included in the input value (or the output).

Figure 15:
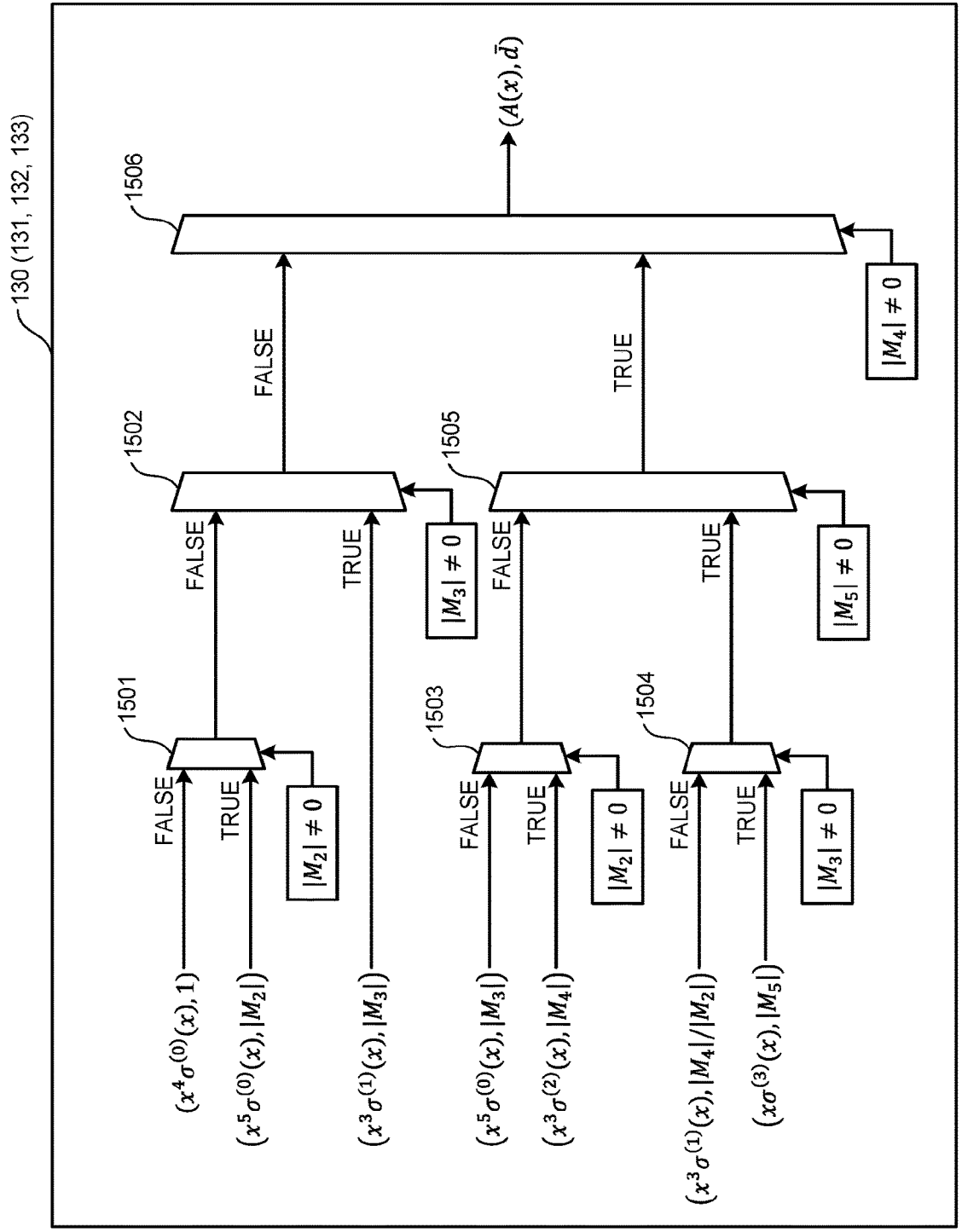
FIG. 15 is a diagram illustrating an example of an I/F module according to a modification.

FIG. 15 is a diagram illustrating an example of a function of the I/F module 130 of the present modification when obtaining the initial value A(x) of the polynomial and the initial value d-bar of the previous discrepancy. The condition determination module 131 of the present modification includes selectors 1501 and 1506 associated with selection conditions for the determination values illustrated in FIG. 15.

(Second Modification)

The processing of outputting the parameter according to the selection condition for the determination value may be executed using a lookup table to transform the selection condition into the output value of the parameter. FIG. 16 is a diagram illustrating an example of the lookup table.

As illustrated in FIG. 16, the lookup table uses a data format in which selection conditions related to determination values $|M_2|$, $|M_3|$, $|M_4|$, and $|M_5|$ are associated with parameters (the initial value C(x) of the error locator polynomial, the initial value A(x) of the polynomial, the initial loop value i, and the initial value d-bar of the previous discrepancy).

The selection condition is expressed in the form of (sc2, sc3, sc4, sc5). Conditions sc2 to sc5 correspond to conditions for $|M_2|$, $|M_3|$, $|M_4|$, and $|M_5|$ respectively, and take any value of "0", "1", or "*". The values "0", "1", and "*" represent that the corresponding determination value is zero, non-zero, and may be any value (wildcard), respectively.

For example, the case $(|M_2|\neq 0, |M_3|\neq 0, |M_4|\neq 0, |M_5|\neq 0) =$ (*,1,1,1) means $|M_5|\neq 0 \& |M_4|\neq 0 \& |M_3|\neq 0$, and $|M_2|$ may be any value. When this selection condition is satisfied, the following parameters are selected and output: $C(x)=\sigma^{(4)}(x)$, $A(x)=x\sigma^{(3)}(x)$, i=4, d-bar=$|M_5|=d(S_7,\sigma^{(3)}(x))$ While FIG. 16 illustrates an example of the lookup table used in the first embodiment, the processing of outputting parameters using the lookup table is similarly applicable to other embodiments. In addition, the parameters to be calculated using the lookup table may be some selected parameters. For example, only C(x) having a large computational complexity may be obtained by using the lookup table.

Second Embodiment

In the second embodiment, a configuration example of a memory system capable of setting the initial loop value i to 3 or more will be described. The overall configuration of the memory system of the present embodiment is similar to that of FIG. 1 illustrating a configuration example of the memory system 1 of the first embodiment. In the present embodiment, a decoder is functionally different from the decoder of the memory system of the first embodiment.

Figure 17:
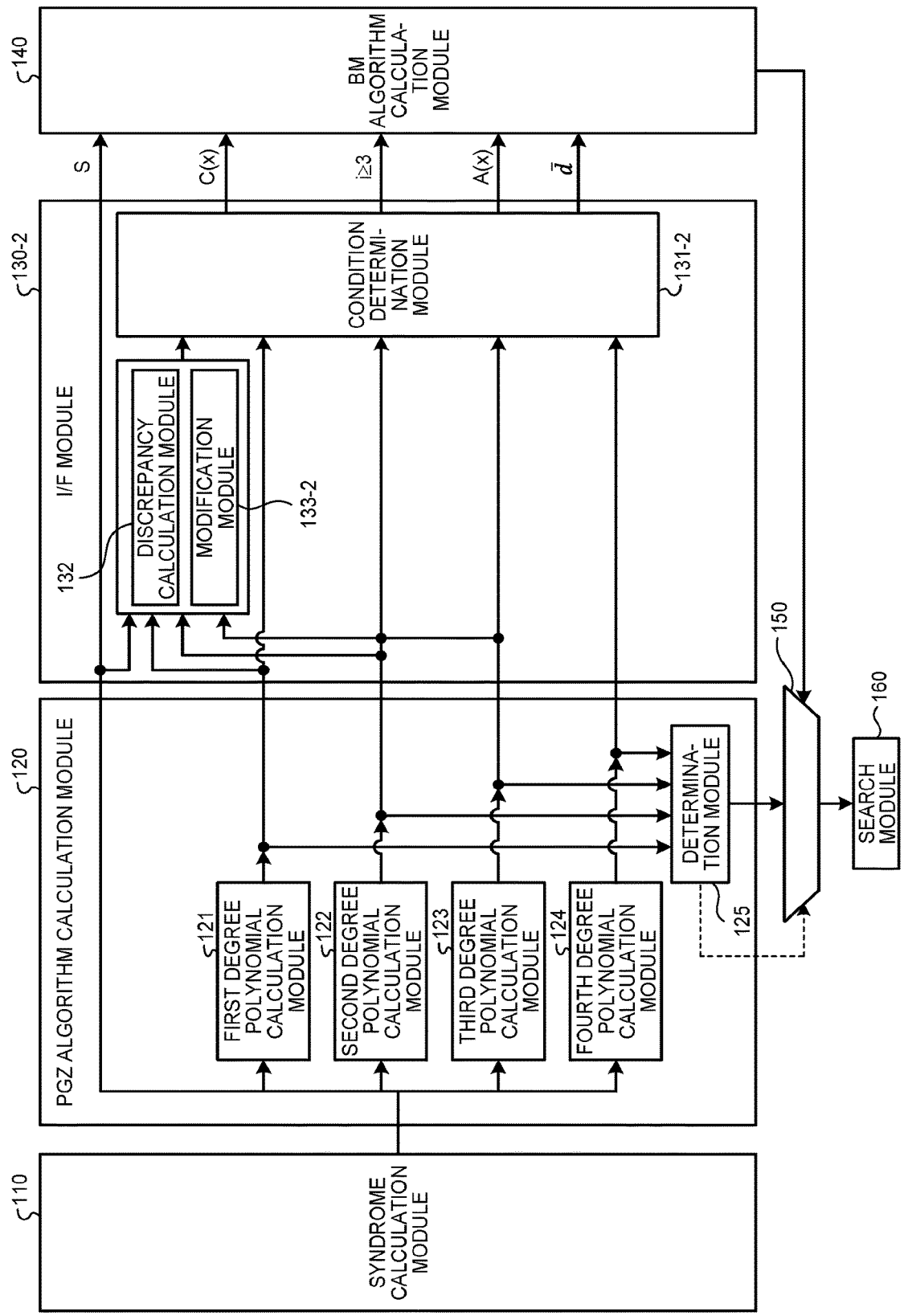
FIG. 17 is a block diagram of a decoder according to a second embodiment.

FIG. 17 is a block diagram illustrating a configuration example of the decoder according to the present embodiment. As illustrated in FIG. 17, the decoder according to the present embodiment includes a syndrome calculation module 110, a PGZ algorithm calculation module 120, an I/F module 130-2, a BM algorithm calculation module 140, a selection module 150, and a search module 160.

In the second embodiment, the I/F module 130 of the decoder of the first embodiment is replaced with the I/F module 130-2. Other configurations and functions are similar to those in FIG. 2 which is a block diagram of the memory system according to the first embodiment, and thus, are denoted by the same reference numerals, and description thereof here is omitted.

The I/F module 130-2 is different from the I/F module 130 of the first embodiment in terms of having an additional input value to be selected according to a selection condition.

The I/F module 130-2 includes a condition determination module 131-2, a discrepancy calculation module 132, and modification module 133-2. The discrepancy calculation module 132 is functionally similar to the unit of the first embodiment, the same reference numerals are given and description thereof is omitted.

The condition determination module 131-2 is different from the condition determination module 131 of the first embodiment in terms of having an additional selector that selects an input value to be added according to the selection condition.

The modification module 133-2 is different from the modification module 133 of the first embodiment in terms of having an additional function of calculating and outputting a polynomial which is a modified polynomial of the error locator polynomial for the sake of the input value to be added.

Hereinafter, the function of each unit will be described in detail with reference to FIGS. 18 to 20.

Figure 18:
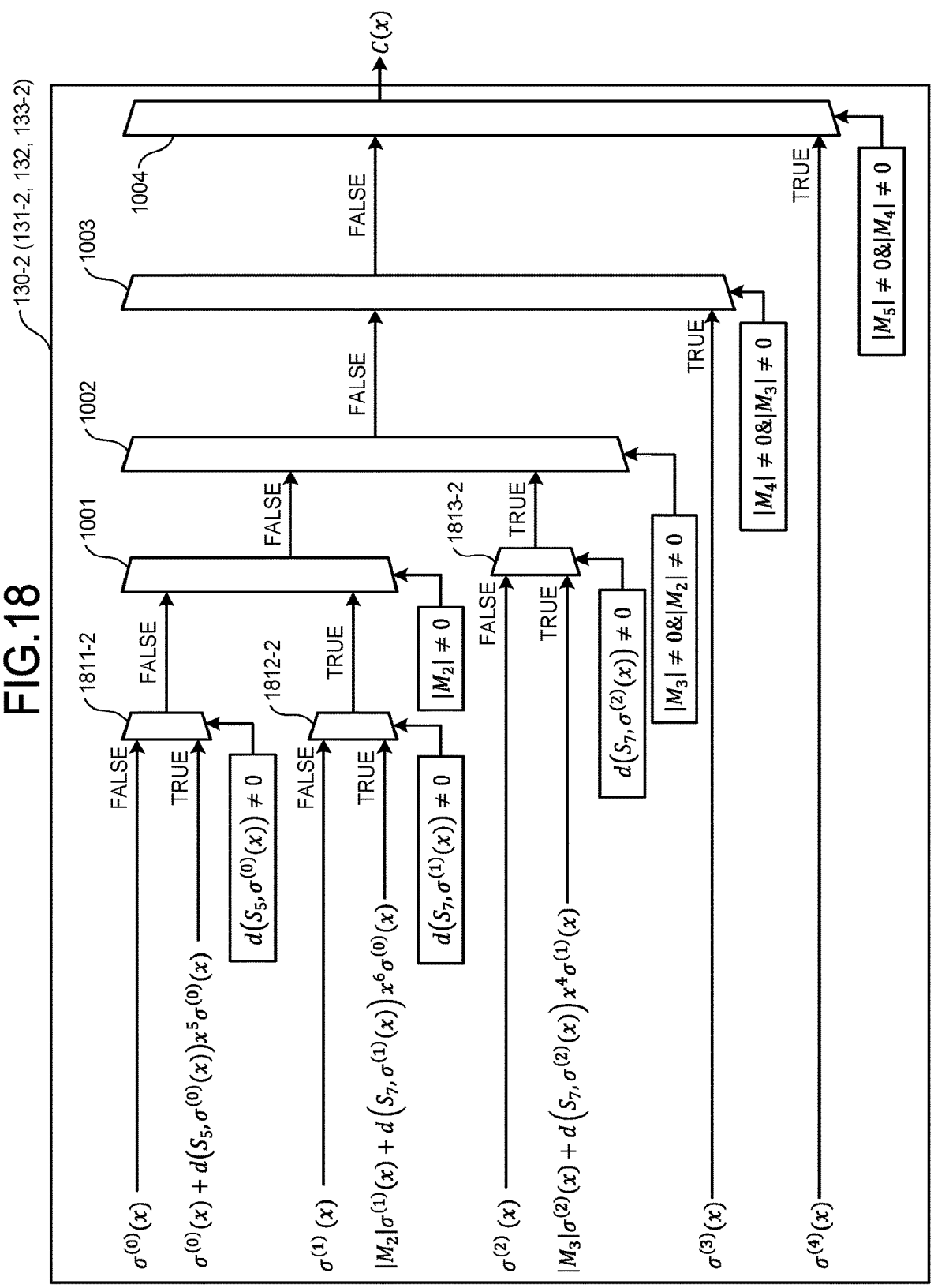
FIG. 18 is a diagram illustrating an example of an I/F module.

FIG. 18 is a diagram illustrating an example of a function of the I/F module 130-2 when obtaining the initial value $C(x)$ of the error locator polynomial. The functions illustrated in FIG. 18 are implemented by the condition determination module 131-2, the discrepancy calculation module 132, and the modification module 133-2, for example.

As illustrated in FIG. 18, for example, the condition determination module 131-2 further includes selectors 1811-2, 1812-2, and 1813-2. As described below, each of the selectors 1811-2, 1812-2, and 1813-2 is associated with a selection condition for a predefined determination value.

(C1) Selector 1811-2
Determination value: $d(S_5, \sigma^{(0)}(x))$
Selection condition: $d(S_5, \sigma^{(0)}(x)) \neq 0$ (C2) Selector 1812-2
Determination value: $d(S_7, \sigma^{(1)}(x))$
Selection condition: $d(S_7, \sigma^{(1)}(x)) \neq 0$ (C3) Selector 1813-2
Determination value: $d(S_7, \sigma^{(2)}(x))$
Selection condition: $d(S_7, \sigma^{(2)}(x)) \neq 0$ For example, the modification module 133-2 outputs the following values as input values to be selected by the respective selectors when the selection condition is "True".

Selector 1811-2: $\sigma^{(0)}(x) + d(S_5, \sigma^{(0)}(x)) x^5 \sigma^{(0)}(x)$
Selector 1812-2:
$d(S_1, \sigma^{(0)}(x)) \sigma^{(1)}(x) + d(S_7, \sigma^{(1)}(x)) x^6 \sigma^{(0)}(x)$
Selector 1813-2:
$d(S_3, \sigma^{(1)}(x)) \sigma^{(2)}(x) + d(S_7, \sigma^{(2)}(x)) x^4 \sigma^{(1)}(x)$ The condition determination module 131-2 outputs the input value selected according to the selection condition illustrated in FIG. 18 as the initial value $C(x)$ of the error locator polynomial.

Figure 19:
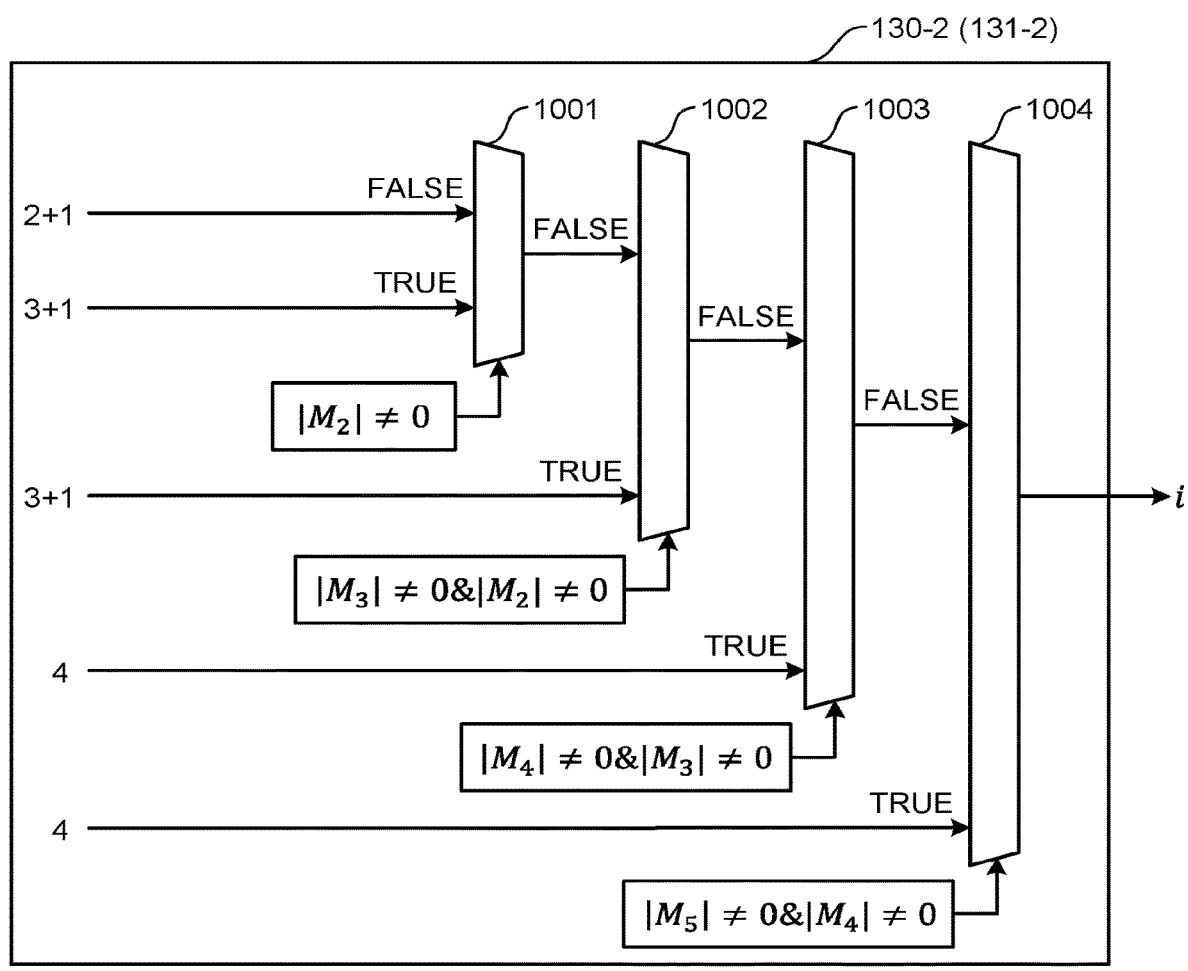
FIG. 19 is a diagram illustrating an example of an I/F module.

FIG. 19 is a diagram illustrating an example of a function of the I/F module 130-2 when obtaining the initial loop value i. The function illustrated in FIG. 19 is implemented by the condition determination module 131-2, for example.

In the present embodiment, the input values at the time of obtaining the initial loop value i are 3 and 4. The condition determination module 131-2 outputs, as the initial loop value i, an input value selected in accordance with the selection condition illustrated in FIG. 19 among these input values.

Although the initial loop value i is 2 or more in the above embodiment, it is possible, in the present embodiment, to set the value of the initial loop value i to 3 or more. This is because it can be interpreted that one step of successive modification by the BM algorithm is executed in advance in the I/F module 130-2. For example, modification related to the added selectors 1811-2, 1812-2, and 1813-2 corresponds to modification executed in advance. By further performing the successive modification by the BM algorithm in advance in the I/F module 130-2, it is possible to further increase the initial loop value.

The determination of "False" by the selector 1811-2 does not occur unless the number of errors is 7 bits or more. Therefore, when the maximum number of corrected bits of the BM algorithm calculation module 140 is less than 7, the selector 1811-2 may be removed. In this case, when the selection condition of the selector 1001 is "False", it is sufficient to constantly output $\sigma^{(0)}(x) + d(S_5, \sigma^{(0)}(x)) x^5 \sigma^{(0)}(x)$. Similarly, the unnecessary selector may be removed according to the maximum number of corrected bits of the BM algorithm calculation module 140. Alternatively, when the maximum number of corrected bits of the BM algorithm calculation module 140 is less than 7, it is also allowable to use the determination of "False" of the selector 1811-2 to notify the BM algorithm calculation module 140 of the decoding failure. This is because an error of 7 bits or more is already validated and thus, decoding will not be successful even with operation of the BM algorithm not capable of correcting 7 bits.

Figure 20:
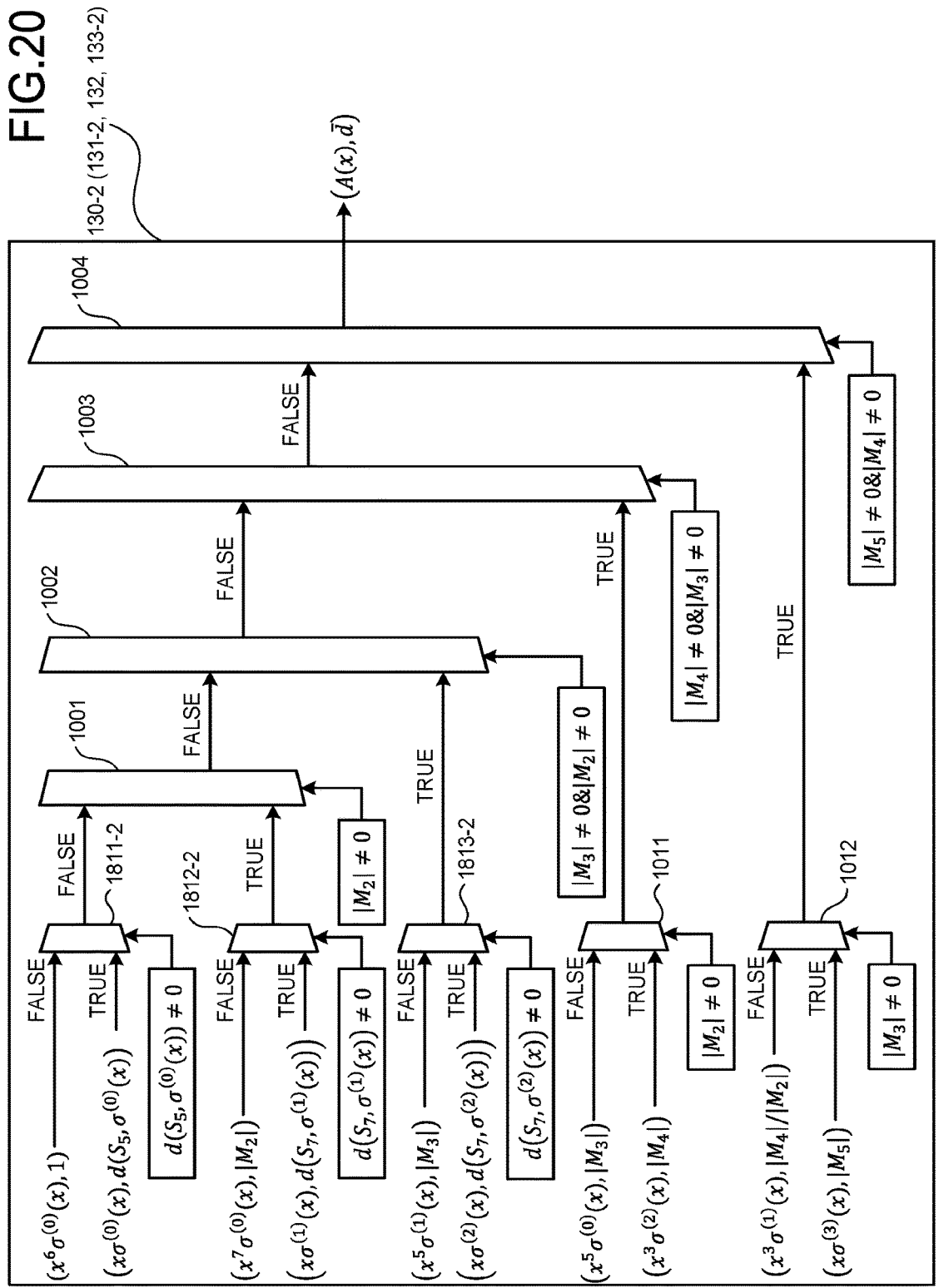
FIG. 20 is a diagram illustrating an example of an I/F module.

FIG. 20 is a diagram illustrating an example of the function of the I/F module 130-2 when obtaining the initial value $A(x)$ of the polynomial and the initial value d-bar of the previous discrepancy. The functions illustrated in FIG. 20 are implemented by the condition determination module 131-2, the discrepancy calculation module 132, and the modification module 133-2, for example.

In the example of FIG. 20, the following input values are added to the added selectors 1811-2, 1812-2, and 1813-2, respectively.

(D1) Selector 1811-2:
$(x^6 \sigma^{(0)}(x), 1)$, $(x \sigma^{(0)}(x), d(S_5, \sigma^{(0)}(x)))$
(D2) Selector 1812-2:
$(x^7 \sigma^{(0)}(x), |M_2|)$, $(x \sigma^{(1)}(x), d(S_7, \sigma^{(1)}(x)))$
(D3) Selector 1813-2:
$(x^5 \sigma^{(1)}(x), |M_3|)$, $(x \sigma^{(2)}(x), d(S_7, \sigma^{(2)}(x)))$ Note that the discrepancy calculation module 132 can calculate the discrepancy $d(S_\mu, \sigma(x))$ of the error locator polynomial by using a calculation formula similar to the above Formula (10), for example.

The condition determination module 131-2 outputs the input value selected according to the selection condition illustrated in FIG. 20 as the initial value $A(x)$ of the polynomial and the initial value d-bar of the previous discrepancy.

(Third Modification)

Figure 21:
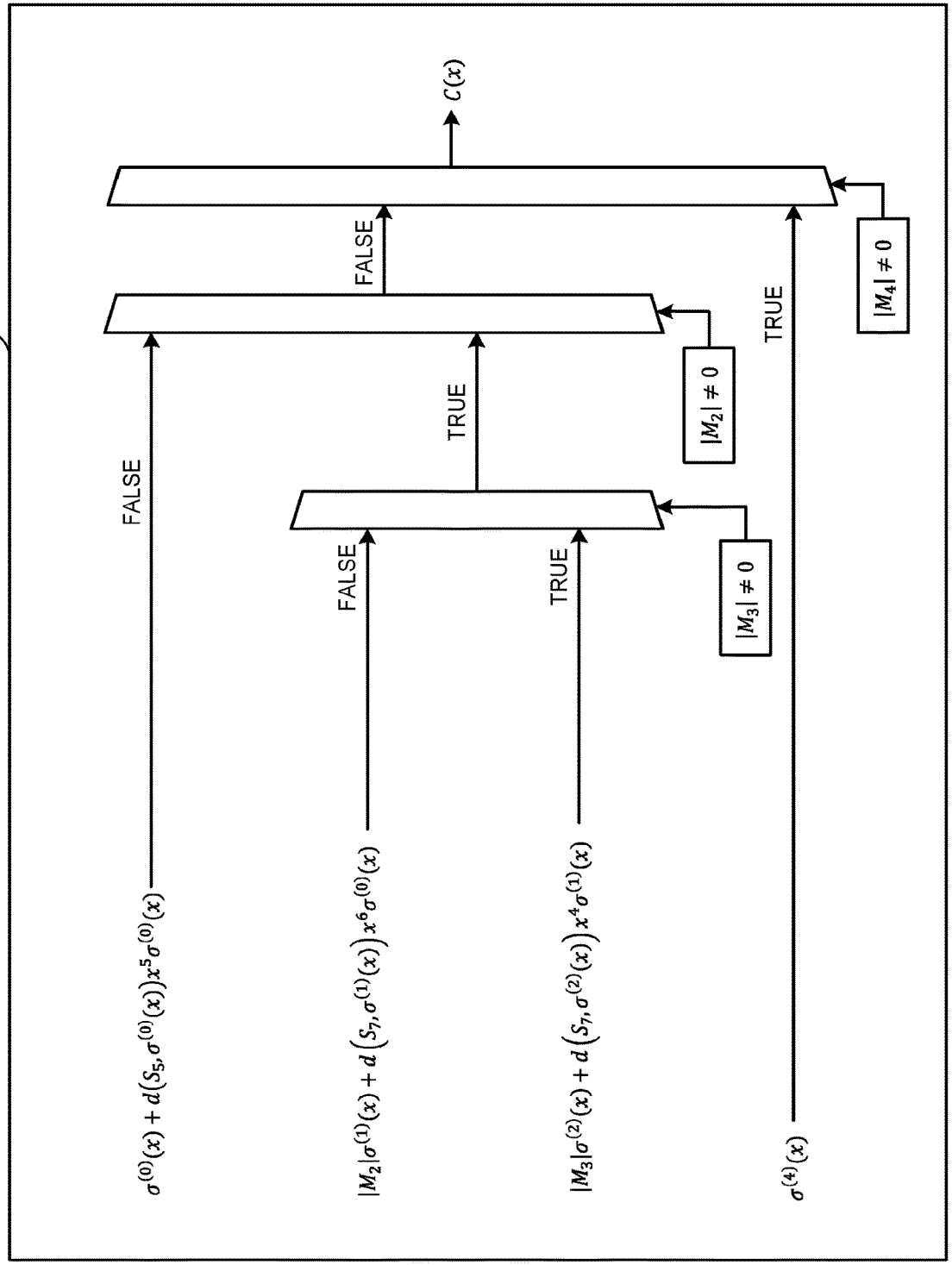
FIG. 21 is a diagram illustrating an example of an I/F module according to a modification.
Figure 22:
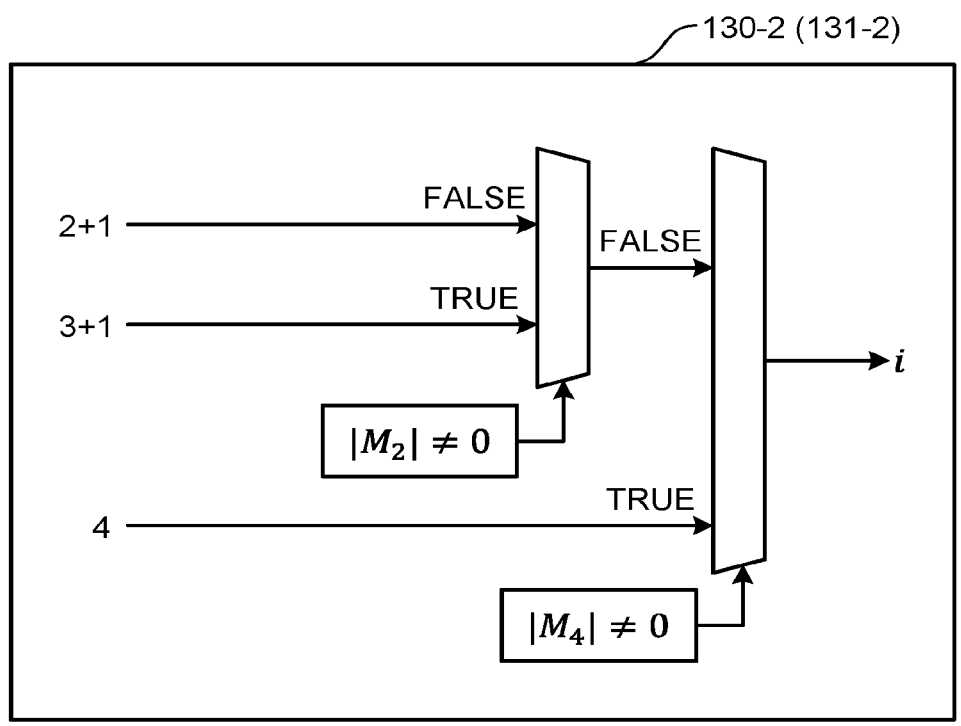
FIG. 22 is a diagram illustrating an example of an I/F module according to a modification.
Figure 23:
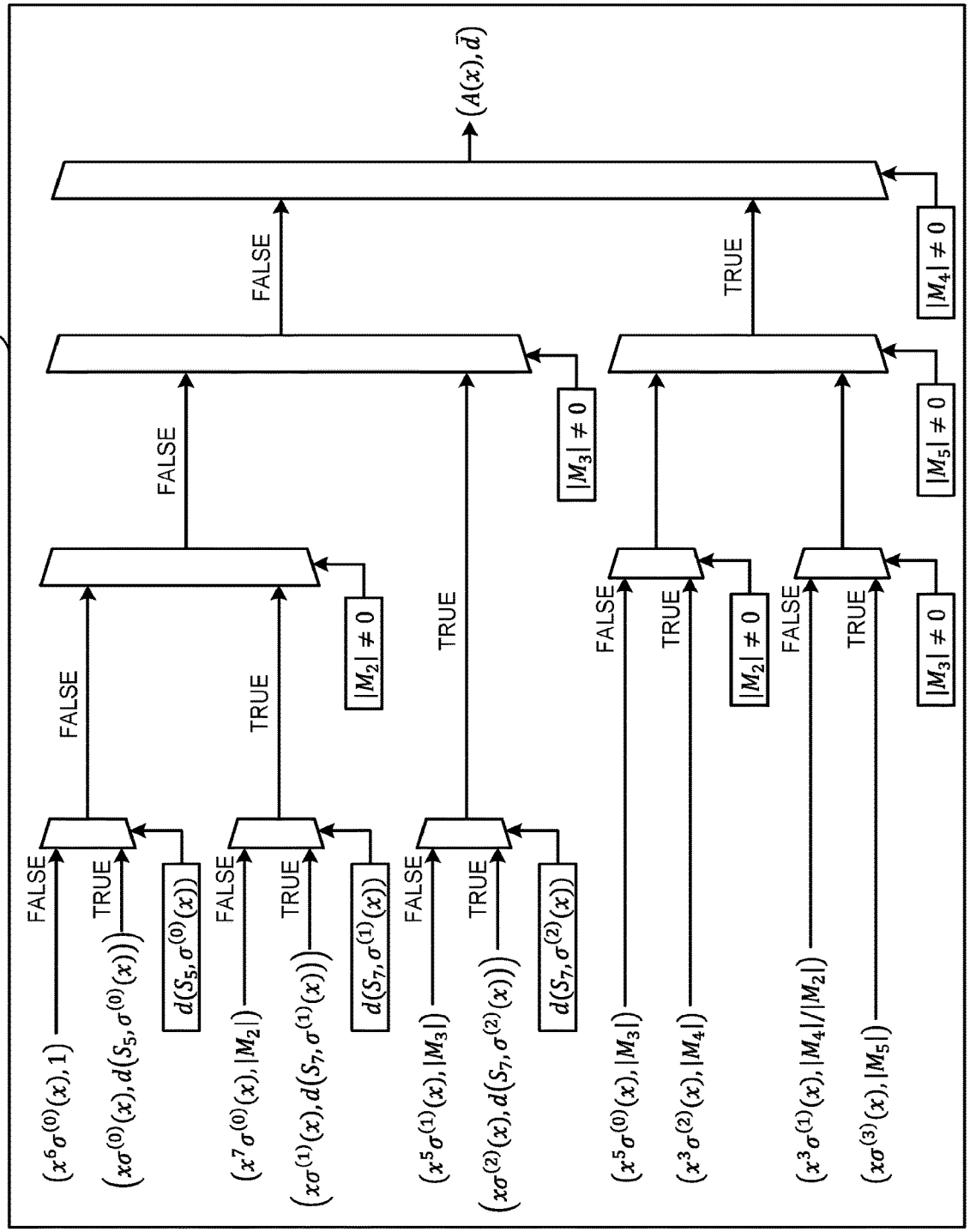
FIG. 23 is a diagram illustrating an example of an I/F module according to a modification.

In a third modification, another configuration example of the I/F module 130-2 will be illustrated. FIGS. 21 to 23 are diagrams illustrating an example of a function of the I/F module 130-2 of the present modification. FIGS. 18 to 20 illustrating the function of the I/F module 130-2 can be replaced with FIGS. 21 to 23, respectively.

In this manner, in the memory system according to the second embodiment, the initial loop value used in the BM algorithm can be increased as compared with the first embodiment. This makes it possible to reduce the number of times of successive modifications by the BM algorithm, leading to achievement of further reduction of latency.

Third Embodiment

The above embodiments are the example in which the low degree error locator polynomials are calculated by the PGZ algorithm. The calculation method of the low degree error locator polynomial is not limited to the PGZ algorithm, and any calculation algorithm may be used as long as it uses an algorithm different from the BM algorithm (including the inversionless BM algorithm) used for the calculation of the higher degree error locator polynomial.

The third embodiment will describe an example of calculating a low degree error locator polynomial by using the Euclidean algorithm. The overall configuration of the memory system of the present embodiment is similar to that of FIG. 1 illustrating a configuration example of the memory system 1 of the first embodiment. In the present embodiment, a decoder is functionally different from the decoder of the memory system of the first embodiment.

Figure 24:
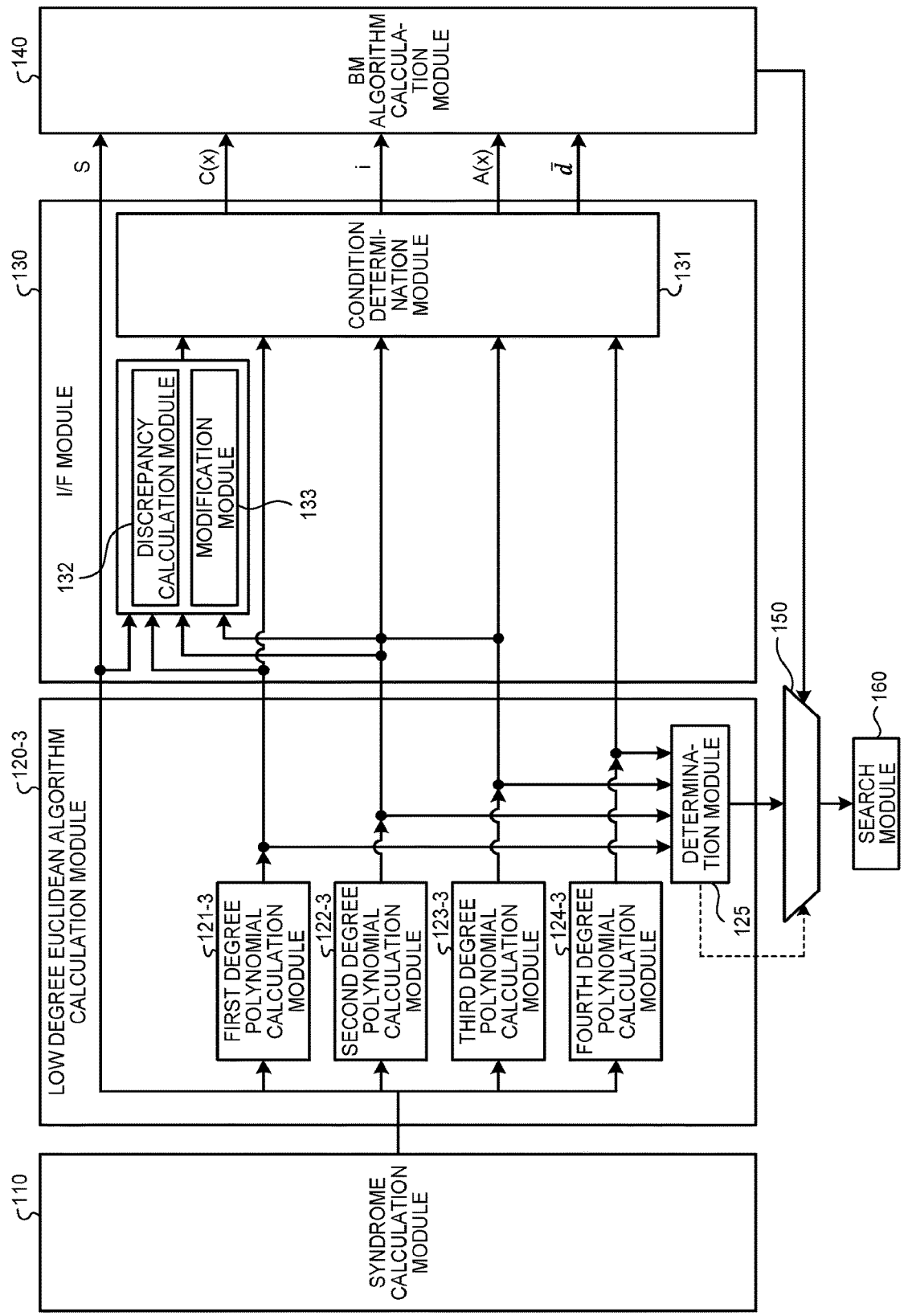
FIG. 24 is a block diagram of a decoder according to a third embodiment.

FIG. 24 is a block diagram illustrating a configuration example of the decoder according to the present embodiment. As illustrated in FIG. 24, the decoder according to the present embodiment includes a syndrome calculation module 110, a low degree Euclidean algorithm calculation module 120-3, an I/F module 130, a BM algorithm calculation module 140, a selection module 150, and a search module 160.

In the third embodiment, the PGZ algorithm calculation module 120 of the first embodiment is replaced with the low degree Euclidean algorithm calculation module 120-3. Other configurations and functions are similar to those in FIG. 2 which is a block diagram of the memory system according to the first embodiment, and thus, are denoted by the same reference numerals, and description thereof here is omitted.

The low degree Euclidean algorithm calculation module 120-3 calculates an error locator polynomial by the Euclidean algorithm using a syndrome. The low degree Euclidean algorithm calculation module 120-3 includes a first degree polynomial calculation module 121-3, a second degree polynomial calculation module 122-3, a third degree polynomial calculation module 123-3, a fourth degree polynomial calculation module 124-3, and a determination module 125. Since the determination module 125 is functionally similar to the unit of the above embodiment, the same reference numerals are given and the description thereof will be omitted.

The first degree polynomial calculation module 121-3, the second degree polynomial calculation module 122-3, the third degree polynomial calculation module 123-3, and the fourth degree polynomial calculation module 124-3 calculate first degree to fourth degree error locator polynomials, respectively, by the Euclidean algorithm. The error locator polynomial to be calculated is similar to the Formulas (1), (2), (3), and (4), except that the present embodiment calculates the error locator polynomial by using the Euclidean algorithm instead of the PGZ algorithm.

With the calculation of the first degree to fourth degree error locator polynomials executed at a higher speed than the four steps of successive modifications performed by the BM algorithm, for example, it is possible to reduce the latency of the decoding processing in the present embodiment similarly to FIG. 13.

Note that the present embodiment corresponds to a mode altered based on the first embodiment. It is also possible to use an altered mode based on the second embodiment.

In this manner, in the memory system according to the third embodiment, the procedure similar to that of the above embodiment can be applied even when the low degree error locator polynomial is calculated by using the Euclidean algorithm.

As described above, according to the first to third embodiments, it is possible to improve the error correction capability.

While certain embodiments have been described, these embodiments have been presented by way of example only, and are not intended to limit the scope of the inventions. Indeed, the novel embodiments described herein may be embodied in a variety of other forms; furthermore, various omissions, substitutions, and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a nonvolatile memory configured to store data encoded with an error correction code of correcting errors of 1 bits or less; wherein t is an integer of 2 or more; and
a memory controller configured to:
calculate a syndrome using a received word read from the nonvolatile memory;
execute a first calculation of obtaining first degree to k-th degree error locator polynomials by using the syndrome, wherein k is an integer satisfying $1 \leq k < t$;
determine whether one or more error locations are calculable by the first degree to k-th degree error locator polynomials;
obtain an initial value of a parameter used for a second calculation of obtaining error locator polynomials up to t-th degree by selecting one of a plurality of error locator polynomials including a zeroth degree error locator polynomial and the first degree to k-th degree error locator polynomials when it is determined that the error locations are not calculable by the first degree to k-th degree error locator polynomials, the parameter including a first expression that is an error locator polynomial modified successively and a second expression that is a polynomial used for modification;
execute the second calculation using the initial value;
calculate the error locations by using an error locator polynomial with which the error locations are determined to be calculable or by using error locator polynomials obtained by the second calculation; and
correct the errors in the calculated error locations.

2. The memory system according to claim 1, wherein the first calculation includes calculation of obtaining at least two error locator polynomials in parallel among the first degree to k-th degree error locator polynomials.

3. The memory system according to claim 1, wherein
the error correction code is a Bose-Chaudhuri-Hocquenghem (BCH) code,
the first calculation uses a Peterson-Gorenstein-Zierler (PGZ) algorithm, and
the second calculation uses a Berlekamp-Massey (BM) algorithm.

4. The memory system according to claim 1, wherein the second calculation uses a Berlekamp-Massey (BM) algorithm, the BM algorithm not including calculation of an inverse element.

5. The memory system according to claim 1, wherein the memory controller is configured to:
obtain the initial value of the second expression by modifying one of the zeroth degree to (k−1)th degree error locator polynomials.

6. The memory system according to claim 5, wherein the memory controller is configured to modify, by using a discrepancy, an input expression so as to obtain the initial value of the second expression, the discrepancy being calculated based on the syndrome and the input expression that is one of the zeroth degree to (k−1)th degree error locator polynomials.

7. The memory system according to claim 5, wherein the memory controller is configured to:
determine whether a plurality of selection conditions is satisfied, the plurality of selection conditions being conditions for a plurality of determination values calculated using the syndrome;
obtain one of the zeroth degree to k-th degree error locator polynomials corresponding to one of the plurality of selection conditions determined to be satisfied, as the initial value of the first expression; and
modify the one of the zeroth degree to (k−1)th degree error locator polynomials corresponding to the selection condition determined to be satisfied to obtain the initial value of the second expression.

8. The memory system according to claim 7, wherein the selection condition includes a first condition for the determination value included in a coefficient of a k-th degree term of a k-th degree error locator polynomial, and
the memory controller is configured to obtain, when the first condition is satisfied, the k-th degree error locator polynomial as the initial value of the first expression.

9. The memory system according to claim 7, wherein the memory controller is configured to obtain the initial value of the first expression and the initial value of the second expression corresponding to the selection condition determined to be satisfied, by using a lookup table, the lookup table including a plurality of initial values of the first expression each of which corresponds to one of the plurality of selection conditions and a plurality of initial values of the second expression each of which corresponds to one of the plurality of selection conditions.

10. The memory system according to claim 7, wherein the parameter includes an initial loop value,
the second calculation is started with an n-th degree error locator polynomial among the first degree to k-th degree error locator polynomials, n corresponding to the initial loop value, and
the memory controller is configured to:
obtain an initial loop value corresponding to the selection condition determined to be satisfied; and
execute the second calculation using the initial loop value.

11. A control method of controlling a nonvolatile memory, the control method comprising:
storing, into the nonvolatile memory, data encoded with an error correction code of correcting errors of t bits or less, wherein t is an integer of 2 or more;
reading the data from the nonvolatile memory as a received word;
calculating a syndrome using the received word read from the nonvolatile memory;
executing a first calculation of obtaining first degree to k-th degree error locator polynomials by using the syndrome, wherein k is an integer satisfying $1 \leq k < t$;
determining whether one or more error locations are calculable by the first degree to k-th degree error locator polynomials;
obtaining an initial value of a parameter used for a second calculation of obtaining error locator polynomials up to t-th degree by selecting one of a plurality of error locator polynomials including a zeroth degree error locator polynomial and the first degree to k-th degree error locator polynomials when it is determined that the error locations are not calculable by the first degree to k-th degree error locator polynomials, the parameter including a first expression that is an error locator polynomial modified successively and a second expression that is a polynomial used for modification;
executing the second calculation using the initial value;
calculating the error locations by using an error locator polynomial with which the error locations are determined to be calculable or by using error locator polynomials obtained by the second calculation; and
correcting the errors in the calculated error locations.

12. The control method according to claim 11, wherein the first calculation includes calculation of obtaining at least two error locator polynomials in parallel among the first degree to k-th degree error locator polynomials.

13. The control method according to claim 11, wherein the error correction code is a Bose-Chaudhuri-Hocquenghem (BCH) code,
the first calculation uses a Peterson-Gorenstein-Zierler (PGZ) algorithm, and
the second calculation uses a Berlekamp-Massey (BM) algorithm.

14. The control method according to claim 11, wherein the second calculation uses a Berlekamp-Massey (BM) algorithm, the BM algorithm not including calculation of an inverse element.

15. The control method according to claim 11, wherein the control method further comprises:
obtaining the initial value of the second expression by modifying one of the zeroth degree to (k−1)th degree error locator polynomials.

16. The control method according to claim 15, further comprising:
modifying, by using a discrepancy, an input expression so as to obtain the initial value of the second expression, the discrepancy being calculated based on the syndrome and the input expression that is one of the zeroth degree to (k−1)th degree error locator polynomials.

17. The control method according to claim 15, further comprising:
determining whether a plurality of selection conditions is satisfied, the plurality of selection conditions being conditions for a plurality of determination values calculated using the syndrome;
obtaining one of the zeroth degree to k-th degree error locator polynomials corresponding to one of the plurality of selection conditions determined to be satisfied, as the initial value of the first expression; and
modifying the one of the zeroth degree to (k−1)th degree error locator polynomials corresponding to the selection condition determined to be satisfied to obtain the initial value of the second expression.

18. The control method according to claim 17, wherein
the selection condition includes a first condition fir the determination value included in a coefficient of a k-th degree term of a k-th degree error locator polynomial, and
the control method further comprises obtaining, when the first condition is satisfied, the k-th degree error locator polynomial as the initial value of the first expression.

19. The control method according to claim 17, further comprising:
obtaining the initial value of the first expression and the initial value of the second expression corresponding to the selection condition determined to be satisfied, by using a lookup table, the lookup table including a plurality of initial values of the first expression each of which corresponds to one of the plurality of selection conditions and a plurality of initial values of the second expression each of which corresponds to one of the plurality of selection conditions.

20. The control method according to claim 17, wherein
the parameter includes an initial loop value,
the second calculation is started with an n-th degree error locator polynomial among the first degree to k-th degree error locator polynomials, n corresponding to the initial loop value, and
the control method further comprises:
obtaining an initial loop value corresponding to the selection condition determined to be satisfied; and
executing the second calculation using the initial loop value.

* * * * *